US007514353B2

(12) United States Patent
Weidman et al.

(10) Patent No.: US 7,514,353 B2
(45) Date of Patent: Apr. 7, 2009

(54) CONTACT METALLIZATION SCHEME USING A BARRIER LAYER OVER A SILICIDE LAYER

(75) Inventors: Timothy W. Weidman, Sunnyvale, CA (US); Kapila P. Wijekoon, Palo Alto, CA (US); Zhize Zhu, Cupertino, CA (US); Avgerinos V. (Jerry) Gelatos, Redwood City, CA (US); Amit Khandelwal, Santa Clara, CA (US); Arulkumar Shanmugasundram, Sunnyvale, CA (US); Michael X. Yang, Palo Alto, CA (US); Fang Mei, Foster City, CA (US); Farhad K. Moghadam, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 185 days.

(21) Appl. No.: 11/385,344

(22) Filed: Mar. 20, 2006

(65) Prior Publication Data

US 2006/0251800 A1 Nov. 9, 2006

Related U.S. Application Data

(60) Provisional application No. 60/754,230, filed on Dec. 27, 2005, provisional application No. 60/709,564, filed on Aug. 19, 2005, provisional application No. 60/703,633, filed on Jul. 29, 2005, provisional application No. 60/703,538, filed on Jul. 29, 2005, provisional application No. 60/683,599, filed on May 23, 2005, provisional application No. 60/663,493, filed on Mar. 18, 2005.

(51) Int. Cl.
*H01L 21/4763* (2006.01)

(52) U.S. Cl. .............. 438/627; 438/629; 257/E21.575; 257/E21.584

(58) Field of Classification Search ................. 438/571, 438/580–584, 597, 618–627, 639, 644, 648–650, 438/655, 656, 678, 682, 683, 685–688; 257/377, 257/382, 454–456, 471, 485, 486, 576, 754, 257/755, 757, 758, 768–770, E21.575, E21.584, 257/E21.593

See application file for complete search history.

(56) References Cited

U.S. PATENT DOCUMENTS 2,369,620 A   2/1945  Sullivan et al.

(Continued)

FOREIGN PATENT DOCUMENTS

EP          0 329 406          8/1989

(Continued)

OTHER PUBLICATIONS

International Search Report, Jun. 25, 2006.

(Continued)

*Primary Examiner*—Brook Kebede
(74) *Attorney, Agent, or Firm*—Patterson & Sheridan

(57) ABSTRACT

Embodiments of the invention generally provide methods of filling contact level features formed in a semiconductor device by depositing a barrier layer over the contact feature and then filing the layer using an PVD, CVD, ALD, electrochemical plating process (ECP) and/or electroless deposition processes. In one embodiment, the barrier layer has a catalytically active surface that will allow the electroless deposition of a metal on the barrier layer. In one aspect, the electrolessly deposited metal is copper or a copper alloy. In one aspect, the contact level feature is filled with a copper alloy by use of an electroless deposition process. In another aspect, a copper alloy is used to from a thin conductive copper layer that is used to subsequently fill features with a copper containing material by use of an ECP, PVD, CVD, and/or ALD deposition process. In one embodiment, a portion of the barrier layer is purposely allowed to react with traces of residual oxide at the silicon junction of the contact level feature to form a low resistance connection.

33 Claims, 6 Drawing Sheets

U.S. PATENT DOCUMENTS

| | | | |
|---|---|---|---|
| 3,403,035 A | 9/1968 | Schneble et al. |
| 3,745,039 A | 7/1973 | Feldstein et al. |
| 3,937,857 A | 2/1976 | Brummett et al. |
| 4,006,047 A | 2/1977 | Brummett et al. |
| 4,072,781 A | 2/1978 | Shirahata et al. |
| 4,150,177 A | 4/1979 | Guditz et al. |
| 4,232,060 A | 11/1980 | Mallory et al. |
| 4,234,628 A | 11/1980 | DuRose |
| 4,239,810 A | 12/1980 | Alameddine et al. |
| 4,265,943 A | 5/1981 | Goldstein et al. |
| 4,297,393 A | 10/1981 | Denning et al. |
| 4,364,803 A | 12/1982 | Nidola et al. |
| 4,717,591 A | 1/1988 | Acosta et al. |
| 4,808,259 A | 2/1989 | Jillie, Jr. et al. |
| 5,169,680 A | 12/1992 | Ting et al. |
| 5,478,462 A | 12/1995 | Walsh |
| 5,510,216 A | 4/1996 | Calabrese et al. |
| 5,614,003 A | 3/1997 | Mallory et al. |
| 5,648,125 A | 7/1997 | Cane |
| 5,674,787 A | 10/1997 | Zhao et al. |
| 5,695,810 A | 12/1997 | Dubin et al. |
| 5,733,816 A | 3/1998 | Iyer et al. |
| 5,739,579 A | 4/1998 | Chiang et al. |
| 5,755,859 A | 5/1998 | Brusic et al. |
| 5,783,495 A | 7/1998 | Li et al. |
| 5,824,599 A | 10/1998 | Shacham-Diamand et al. |
| 5,830,805 A | 11/1998 | Shacham-Diamand et al. |
| 5,843,538 A | 12/1998 | Ehrsam et al. |
| 5,846,598 A | 12/1998 | Semkow et al. |
| 5,882,433 A | 3/1999 | Ueno |
| 5,885,749 A | 3/1999 | Huggins et al. |
| 5,891,513 A | 4/1999 | Dubin et al. |
| 5,904,827 A | 5/1999 | Reynolds |
| 5,907,790 A | 5/1999 | Kellam |
| 5,910,340 A | 6/1999 | Uchida et al. |
| 5,913,147 A | 6/1999 | Dubin et al. |
| 5,932,077 A | 8/1999 | Reynolds |
| 5,946,799 A | 9/1999 | Yamamoto et al. |
| 5,965,211 A * | 10/1999 | Kondo et al. | 427/443.1 |
| 5,969,422 A | 10/1999 | Ting et al. |
| 5,998,873 A * | 12/1999 | Blair et al. | 257/766 |
| 6,010,962 A | 1/2000 | Liu et al. |
| 6,015,724 A | 1/2000 | Yamazaki |
| 6,015,747 A | 1/2000 | Lopatin et al. |
| 6,046,108 A * | 4/2000 | Liu et al. | 438/687 |
| 6,065,424 A | 5/2000 | Shacham-Diamand et al. |
| 6,077,780 A | 6/2000 | Dubin |
| 6,100,184 A | 8/2000 | Zhao et al. |
| 6,107,199 A | 8/2000 | Allen et al. |
| 6,110,530 A | 8/2000 | Chen et al. |
| 6,113,771 A | 9/2000 | Landau et al. |
| 6,136,163 A | 10/2000 | Cheung et al. |
| 6,136,693 A | 10/2000 | Chan et al. |
| 6,140,234 A | 10/2000 | Uzoh et al. |
| 6,144,099 A | 11/2000 | Lopatin et al. |
| 6,153,935 A | 11/2000 | Edelstein et al. |
| 6,165,912 A | 12/2000 | McConnell et al. |
| 6,171,661 B1 | 1/2001 | Zheng et al. |
| 6,174,812 B1 | 1/2001 | Hsiung et al. |
| 6,180,523 B1 | 1/2001 | Lee et al. |
| 6,197,181 B1 | 3/2001 | Chen |
| 6,197,364 B1 | 3/2001 | Paunovic et al. |
| 6,197,688 B1 | 3/2001 | Simpson |
| 6,228,233 B1 | 5/2001 | Lakshmikanthan et al. |
| 6,242,349 B1 | 6/2001 | Nogami et al. |
| 6,245,670 B1 | 6/2001 | Cheung et al. |
| 6,251,236 B1 | 6/2001 | Stevens |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,258,707 B1 | 7/2001 | Uzoh |
| 6,261,637 B1 | 7/2001 | Oberle |
| 6,277,263 B1 | 8/2001 | Chen |
| 6,277,709 B1 * | 8/2001 | Wang et al. | 438/430 |
| 6,290,833 B1 | 9/2001 | Chen |
| 6,291,082 B1 | 9/2001 | Lopatin |
| 6,291,348 B1 | 9/2001 | Lopatin et al. |
| 6,309,967 B1 | 10/2001 | Honeycutt et al. |
| 6,309,969 B1 | 10/2001 | Oskam et al. |
| 6,319,387 B1 | 11/2001 | Krishnamoorthy et al. |
| 6,323,128 B1 | 11/2001 | Sambucetti et al. |
| 6,342,733 B1 | 1/2002 | Hu et al. |
| 6,344,125 B1 | 2/2002 | Locke et al. |
| 6,344,410 B1 | 2/2002 | Lopatin et al. |
| 6,350,364 B1 | 2/2002 | Jang |
| 6,369,429 B1 | 4/2002 | Pramanick et al. |
| 6,372,657 B1 | 4/2002 | Hineman et al. |
| 6,416,647 B1 | 7/2002 | Dordi et al. |
| 6,428,673 B1 | 8/2002 | Ritzdorf et al. |
| 6,429,493 B1 * | 8/2002 | Asahina et al. | 257/382 |
| 6,431,190 B1 | 8/2002 | Oka et al. |
| 6,432,819 B1 | 8/2002 | Pavate et al. |
| 6,432,821 B1 | 8/2002 | Dubin et al. |
| 6,435,398 B2 | 8/2002 | Hartfield et al. |
| 6,436,267 B1 | 8/2002 | Carl et al. |
| 6,436,816 B1 | 8/2002 | Lee et al. |
| 6,441,492 B1 | 8/2002 | Cunningham |
| 6,486,055 B1 | 11/2002 | Jung et al. |
| 6,503,834 B1 | 1/2003 | Chen et al. |
| 6,516,815 B1 | 2/2003 | Stevens et al. |
| 6,517,894 B1 | 2/2003 | Hongo et al. |
| 6,528,409 B1 | 3/2003 | Lopatin et al. |
| 6,544,399 B1 | 4/2003 | Landau et al. |
| 6,551,483 B1 | 4/2003 | Mayer et al. |
| 6,565,729 B2 | 5/2003 | Chen et al. |
| 6,573,606 B2 | 6/2003 | Sambucetti et al. |
| 6,588,437 B1 | 7/2003 | Higashi |
| 6,596,151 B2 | 7/2003 | Landau et al. |
| 6,605,874 B2 | 8/2003 | Leu et al. |
| 6,616,772 B2 | 9/2003 | de Larios et al. |
| 6,616,967 B1 | 9/2003 | Test |
| 6,620,719 B1 | 9/2003 | Andry et al. |
| 6,632,345 B1 | 10/2003 | Chen |
| 6,638,410 B2 | 10/2003 | Chen et al. |
| 6,645,550 B1 | 11/2003 | Cheung et al. |
| 6,645,567 B2 | 11/2003 | Chebiam et al. |
| 6,680,540 B2 | 1/2004 | Nakano et al. |
| 6,709,563 B2 | 3/2004 | Nagai et al. |
| 6,717,189 B2 | 4/2004 | Innoue et al. |
| 6,743,473 B1 | 6/2004 | Parkhe et al. |
| 6,756,682 B2 | 6/2004 | Sinha et al. |
| 6,787,450 B2 | 9/2004 | Sinha et al. |
| 6,794,288 B1 | 9/2004 | Kolics et al. |
| 6,797,312 B2 | 9/2004 | Kong et al. |
| 6,821,909 B2 | 11/2004 | Ramanathan et al. |
| 6,824,612 B2 | 11/2004 | Stevens et al. |
| 6,824,666 B2 | 11/2004 | Gandikota et al. |
| 6,852,584 B1 | 2/2005 | Chen et al. |
| 6,852,618 B2 | 2/2005 | Chopra |
| 6,881,671 B2 | 4/2005 | Jensen et al. |
| 7,071,018 B2 | 7/2006 | Mason et al. |
| 2001/0042689 A1 | 11/2001 | Chen |
| 2002/0019127 A1 | 2/2002 | Givens |
| 2002/0098681 A1 | 7/2002 | Hu et al. |
| 2002/0098711 A1 | 7/2002 | Klein |
| 2002/0182385 A1 | 12/2002 | Senkevich et al. |
| 2003/0010645 A1 | 1/2003 | Ting et al. |
| 2003/0075808 A1 | 4/2003 | Inoue et al. |
| 2003/0113576 A1 | 6/2003 | Chebiam et al. |
| 2003/0116439 A1 | 6/2003 | Seo et al. |
| 2003/0141018 A1 | 7/2003 | Stevens et al. |
| 2003/0155247 A1 | 8/2003 | Miura et al. |
| 2003/0162316 A1 | 8/2003 | Zangmeister et al. |
| 2003/0181040 A1 | 9/2003 | Ivanov et al. |

| | | |
|---|---|---|
| 2003/0186535 A1 | 10/2003 | Wong et al. |
| 2003/0189026 A1 | 10/2003 | Padhi et al. |
| 2004/0009883 A1 | 1/2004 | Ikemoto et al. |
| 2004/0035316 A1 | 2/2004 | Chebiam et al. |
| 2004/0038073 A1 | 2/2004 | Chebiam et al. |
| 2004/0043601 A1* | 3/2004 | Park et al. ............... 438/629 |
| 2004/0065540 A1 | 4/2004 | Mayer et al. |
| 2004/0072419 A1 | 4/2004 | Baskaran et al. |
| 2004/0096592 A1 | 5/2004 | Chebiam et al. |
| 2004/0105934 A1 | 6/2004 | Chang et al. |
| 2004/0113277 A1 | 6/2004 | Chiras et al. |
| 2004/0175509 A1 | 9/2004 | Kolics et al. |
| 2004/0176620 A1 | 9/2004 | Kuperman et al. |
| 2004/0241321 A1 | 12/2004 | Ganguli et al. |
| 2004/0262772 A1 | 12/2004 | Ramanathan et al. |
| 2004/0265501 A1 | 12/2004 | Choi et al. |
| 2005/0006245 A1 | 1/2005 | Sun et al. |
| 2005/0090098 A1 | 4/2005 | Dubin et al. |
| 2005/0118807 A1 | 6/2005 | Kim et al. |
| 2005/0124154 A1 | 6/2005 | Park et al. |
| 2005/0136185 A1 | 6/2005 | Ramanathan et al. |
| 2005/0189013 A1 | 9/2005 | Hartley |
| 2005/0212058 A1 | 9/2005 | Huang et al. |
| 2005/0212139 A1 | 9/2005 | Leinikka et al. |
| 2005/0238808 A1 | 10/2005 | Gatineau et al. |
| 2005/0258499 A1 | 11/2005 | Huang et al. |
| 2008/0110491 A1 | 5/2008 | Buller et al. |
| 2008/0121276 A1 | 5/2008 | Lopatin et al. |

FOREIGN PATENT DOCUMENTS

| | | |
|---|---|---|
| EP | 0 475 567 | 3/1992 |
| EP | 0 913 498 | 5/1999 |
| GB | 2285174 | 6/1995 |
| JP | 59215473 A | 12/1984 |
| JP | 7-297543 | 11/1995 |
| JP | 11-124682 | 5/1999 |
| WO | WO 88/08887 | 11/1988 |

OTHER PUBLICATIONS

Sergey Lopatin, "Electrochemical Metallization of Nanostructures: Integrated Circuits and Micro-Electro-Mechanical Systems", Recent Res. Devel. Electrochem, 6(2003): 57-100, ISBN: 81-7895-107-X.

PCT International Search Report and Written Opinion dated Jun. 10, 2008 for International Application No. PCT/US2006/10220.

Pan, et al. "Novel Approach to Reduce Source/Drain Series Resistance in High Performance CMOS Devices Using Self-Aligned CoWP Process for 45nm Node UTSOI Transistors with 20nm Gate Length". 2006 Symposium on VLSI Technology Digest of Technical Papers Aug. 2006 © 2006 IEEE.

Osaka, et al. "Electroless Nickel Ternary Alloy Deposition on $SiO_2$ for Application to Diffusion Barrier Layer in Copper Interconnect Technology". Journal of the Electrochemical Society vol. 149 (2002) pp. C573-C578.

Takano, et al. "Mechanism of the Chemical Deposition of Nickel on Silicon Wafers in Aqueous Solution". Journal of the Electrochemical Society vol. 146 (1999) pp. 1407-1411.

HSU, et al., "Displacement Activation of Tantalum Diffusion Barrier Layer for Electroless Copper Deposition". Journal of the Electrochemical Society vol. 148 (2001) pp. C590-C598.

Hong, et al. "The Effect of $NH_3$ Plasma Treatment on the Electroless Copper Deposition on $TaN_x$ ($x=0=1$) Diffusion Barriers". Electrochemical and Solid-State Letters, vol. 6 (2003) pp. C12-C15.

Wang, et al., "Bottom-Up Fill for Submicrometer Copper Via Holes of ULSIs by Electroless Plating". Journal of the Electrochmical Society, vol. 151 (2004) pp. C781-C785.

Shingubara, et al., "Bottom-Up Fill of Copper in Deep Submicrometer Holes by Electroless Plating". Electrochemical and Solid-State Letters, vol. 7 (2004) pp. C78-C80.

Paunovic, Milan "Electrochemically Deposited Thin Films" The Electrochemical Society, Inc., Electrodeposition Division Proceedings vol. 94-31 pp. 293-303, (1995).

Dubin, et al. "Selective and Blanket Electroless Copper Deposition for Ultralarge Scale Integration," J. Electrochem. Soc., vol. 144, No. 3, Mar. 1997, pp. 898-908.

Eze, et al. "Chemical-bath-deposited cobalt sulphide films: preparation effects," Materials Chemistry and Physics, 47 (1997), pp. 31-36.

Eze "Electroless deposition of CoO thin films," J. Phys. D. Appl. Phys. 32 (1999), pp. 533-540.

Georgiou, et al. "Thick Selective Electroless-Plated Cobalt-Nickel Alloy Contacts to $CoSi_2$," J. Electrochem. Soc., vol. 138, No. 7, Jul. 1991, pp. 2061-2069.

Hu, et al. "Reduced electromigration of Cu wires by surface coating," Applied Physics Letters, vol. 81, No. 10, Sep. 2002, pp. 1782-1784.

Lin, et al. "Manufacturing of Cu/Electroless Nickel/Sn-Pb Flip Chip Solder Bumps," IEEE Transactions on Advanced Packaging, vol. 22, No. 4 (Nov. 1999), pp. 575-579.

Lopatin, et al. "Thin Electroless barrier for copper films," Part of the SPIE Conference of Multilevel Interconnect technology II, SPIE vol. 3508 (1998), pp. 65-77.

Pearlstein, et al. "Electroless Cobalt Deposition from Acid Baths," J. Electrochem. Soc.: Electrochemical Science and Technology, Aug. 1974, vol. 121, No. 8, pp. 1023-1028.

Pearlstein "Electroless Plating," J. Res. Natl. Bur. Stan., Ch. 31 (1963), pp. 710-747.

Saito, et al. "Electroless deposition of Ni—B, Co—B and Ni—Co—B alloy using dimethylamineborane as a reducing agent," J. of Appl. Electrochemistry 28 (1998), pp. 559-563.

Shacham-Diamand, et al. "Copper electroless deposition technology for ultra-large-scale-integration (ULSI) metallization," Microelectric Engineering 33 (1997), pp. 47-58.

Shacham-Diamand, et al. "Electrochemically deposited thin film alloys for ULSI and MEMS applications," Microelectronic Engineering 50 (2000), pp. 525-531.

Shacham-Diamand, et al. "Electroless copper deposition for ULSI," Thin Solid Films 262 (1995), pp. 93-103.

Shacham-Diamand, et al. "High Aspect Ratio Quarter-Micron Electroless Copper Integrated Technology," Microelectronic Engineering 37/38 (1997), pp. 77-88.

Shacham-Diamand, et al. "Integrated electroless metallization for ULSI," Electrochimica Acta 44 (1999), pp. 3639-3649.

Shacham-Diamand, et al. "Material properties of electroless 100-200 nm thick CoWP films," Electrochemical Society Proceedings, vol. 99-34, pp. 102-110, unknown date.

Ting, et al. "Selective Electroless Metal Deposition for Via Hole Filling in VLSI Multilevel Interconnection Structures," J. Electrochem. Soc., vol. 136, No. 2, Feb. 1989, pp. 462-465.

Sergey Lopatin, "Electrochemical Metallization Of Nanostructures: Integrated Circuits And Micro-Electro-Mechanical Systems", Recent Res. Devel. Electrochem, 6(2003): 57-100, ISBN: 81-7895-107-X.

* cited by examiner

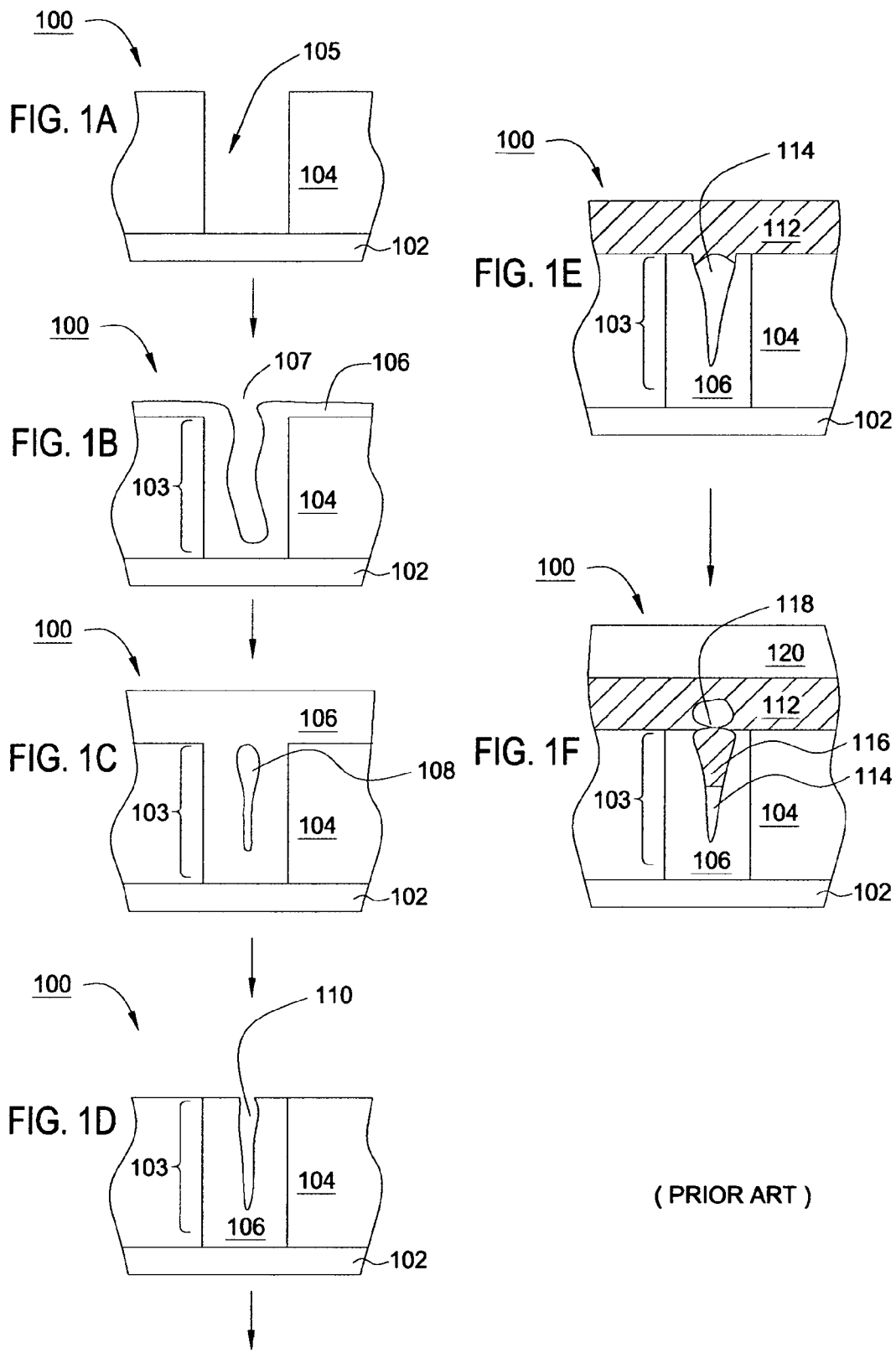
(PRIOR ART)

CONTACT METALLIZATION SCHEME USING A BARRIER LAYER OVER A SILICIDE LAYER

CROSS-REFERENCE TO RELATED APPLICATIONS

This application claims benefit of U.S. Provisional Patent Application Ser. No. 60/663,493, filed Mar. 18, 2005, U.S. Provisional Patent Application Ser. No. 60/683,599, filed May 23, 2005, U.S. Provisional Patent Application Ser. No. 60/703,538, filed Jul. 29, 2005, U.S. Provisional Patent Application Ser. No. 60/703,633, filed Jul. 29, 2005, U.S. Provisional Patent Application Ser. No. 60/709,564, filed Aug. 19, 2005, and U.S. Provisional Patent Application Ser. No. 60/754,230, filed Dec. 27, 2005, which are all herein incorporated by reference. This application is also related to U.S. patent application Ser. No. 11/385,290, filed Mar. 20, 2006, U.S. patent application Ser. No. 11/385,047, filed Mar. 20, 2006, U.S. patent application Ser. No. 11/385,043, filed Mar. 20, 2006, and U.S. patent application Ser. No. 11/385,484, filed Mar. 20, 2006.

BACKGROUND OF THE INVENTION

1. Field of the Invention

Embodiments of the invention generally relate to methods for depositing materials on a substrate, and more specifically to methods for filling apertures within a contact formed on a substrate.

2. Description of the Related Art

Multilevel, 45 nm node metallization is one of the key technologies for the next generation of very large scale integration (VLSI). The multilevel interconnects that lie at the heart of this technology possess features with small CD's and high aspect ratios including contacts, vias, lines and other apertures. Reliable formation of these features is very important for the success of VLSI and the continued effort to increase quality and circuit density on individual substrates. Therefore, there is a great amount of ongoing effort being directed to the formation of void-free features with low contact resistance for the 45 nm node and nodes below.

Tungsten is a choice metal for filling VLSI features, such as sub-micron contact on a substrate. Conventional "contacts" are formed by depositing a conductive interconnect material, such as tungsten into an aperture (e.g., via) on the surface of insulating material disposed between two spaced-apart conductive layers. The aspect ratio of such an opening may inhibit deposition of a conformal conductive interconnect material to fill an aperture. Although tungsten is a popular interconnect material, vapor deposition processes for depositing tungsten commonly suffer from void or a seam type defect creation within the contact plug, as illustrated in FIG. 1C. Also, tungsten is has a relatively high resistivity, which will result in a high circuit resistance formed using the tungsten containing contact.

FIG. 1A depicts a schematic cross-sectional view of an integrated circuit device on substrate 100 containing a via or aperture 105 formed in dielectric layer 104 to expose contact layer 102. During a vapor deposition process that may include chemical vapor deposition (CVD) or atomic layer deposition (ALD), a tungsten layer 106 is deposited on dielectric layer 104 and within aperture 105 including on contact layer 102 and the sidewalls of dielectric layer 104 to form plug 103, as illustrated in FIG. 1B. Near the opening 107 of plug 103, tungsten layer 106 may pinch off, depicted in FIG. 1C, so that plug 103 maintains a seam or a void 108 therein. During a subsequent chemical mechanical polishing (CMP) process that removes a portion of tungsten layer 106 and dielectric layer 104 from the surface of substrate 100, void 108 may be breached or exposed to form gap 110 within plug 103, as illustrated in FIG. 1D. FIG. 1E depicts conductive layer 112 (e.g., copper) deposited on substrate 100 forming void 114 by enclosing gap 110. Substrate 100 may contain additional layers of material depending on the overall architecture of the electronic device. For example, dielectric layer 104 may be covered by a barrier layer (not shown) thereon prior to the deposition of conductive layer 112 and/or conductive layer 112 may also contain a barrier layer (not shown) thereon prior to the deposition of layer 120.

Defects, such as a seam or a void 114, may cause a series of problems during the fabrication of electronic devices depicted herein. The resistance to current flow through the plug 103 is impaired due to the lack of tungsten material in the void 114. However, a more serious obstacle during fabrication is the displacement of voids from one layer to the next. For example, subsequent fabrication processes of substrate 100 may include the deposition of layer 120 (e.g., dielectric layer) on conductive layer 112. During subsequent thermal processing, such as an annealing process, the material 116 from conductive layer 112 may diffuse into void 114 and form a void 118 within conductive layer 112. As illustrated in FIG. 1F, material 116 may not diffuse completely to the bottom of void 114. The defect formed in the conductive layer 112, such as void 118, will increase the resistance of the circuit containing the defect and thus affect device performance. Ultimately, the defects in the conductive layer 112 can affect the device yield of the fabricated substrate. Therefore, there is a need for a method of reliably forming a plug 103 that does not have a seam or void type defect.

Also, one limitation of device performance, or device speed, is related to the resistance of the circuit formed in the semiconductor device. If the geometry of the device(s) remain the same (e.g., trace length, contact feature aspect ratio) the main factor that effects the resistance of a formed circuit is the resistivity of the materials used to form the device. The lower the resistivity, the better one material will perform versus another material. For example, the resistivity of pure tungsten is about 3.3 times higher than the resistivity of pure copper and thus a copper containing device would be faster than a comparable circuit made using tungsten. This among other reasons is often why copper interconnects are formed on integration levels M1 and above. In general, the term metal layer 1, or M1 layer, is generally intended to describe an interconnect layer (e.g., conductive layer 112) formed over the contact level layer, such as a tungsten plug (e.g., plug 103) that is formed during the contact layer formation process. Tungsten is commonly used at the contact level features due to it ability to fill features using CVD processes and it will not rapidly diffuse into silicon and adjacent oxide layers.

Reliably producing nanometer-sized features is one of the key technologies for the next generation of very large scale integration (VLSI) and ultra large scale integration (ULSI) of semiconductor devices. However, as the fringes of circuit technology are pressed, the shrinking dimensions of interconnects in VLSI and ULSI technology have placed additional demands on the processing capabilities. The multilevel interconnects that lie at the heart of this technology require precise processing of the contact level features (e.g., contacts, vias and other interconnects). Reliable formation of these interconnects is very important to VLSI and ULSI success and to the continued effort to increase circuit density and quality of individual substrates.

Copper has become the metals of choice for nanometer-sized interconnect technology used in the metal layers M1 and above because copper has a lower electrical resistivity than most commonly used metals (e.g., aluminum) and a higher current carrying capacity. These characteristics are important for supporting the higher current densities experienced at high levels of integration and increased device speed. Further, copper has a good thermal conductivity and is available in a highly pure state. Unfortunately, the use of copper at the contact level of a device has a number of drawbacks which include that it rapidly diffuses through silicon and dielectric materials, it has a relatively low melting point which can limit the maximum allowable silicidation formation temperature.

Therefore, there exists a need for an improved contact level device that is void free, that has a low electrical resistance, that has good electromigration performance, that is reliable, and that can be reliably formed.

SUMMARY OF THE INVENTION

The present invention generally provide a method for depositing a material on a contact level feature formed on a substrate, comprising providing a substrate that has one or more contact level features that have an exposed silicide layer formed on a silicon containing region, depositing a barrier layer over the surface of the exposed silicide layer, wherein the depositing the barrier layer comprises depositing a first metal layer on the exposed silicide layer, and depositing a second metal layer over the first metal layer, wherein the second metal layer contains a metal selected from a group consisting of ruthenium (Ru), cobalt (Co), nickel (Ni), rhodium (Rh), iridium (Ir), palladium (Pd) and platinum (Pt), and filling the contact level feature with a metal containing layer.

Embodiments of the invention further provide a material on a contact level feature formed on a substrate, comprising providing a substrate that has one or more contact level features that have an exposed silicide layer formed on a doped silicon containing region, depositing a barrier layer over the surface of the exposed silicide layer, wherein the depositing the barrier layer comprises depositing a first metal layer on the exposed silicide layer, and depositing a second metal layer over the first metal layer, wherein the second metal layer contains a metal selected from a group consisting of ruthenium (Ru), cobalt (Co), nickel (Ni), rhodium (Rh), iridium (Ir), palladium (Pd) and platinum (Pt), electrolessly depositing a first copper containing layer on the barrier layer, and depositing a second copper containing layer on the first copper containing layer to fill the one or more contact level features.

Embodiments of the invention further provide a method for depositing a material on a contact level feature formed on a substrate, comprising depositing a barrier layer over the surfaces of one or more contact level features formed on the substrate, and electrolessly depositing a copper containing layer on the barrier layer using a metal layer electroless deposition solution, wherein the metal layer electroless deposition solution comprises EDTA and copper ions at a concentration ratio of less than about 6:1.

Embodiments of the invention further provide a method for depositing a material on a contact level feature formed on a substrate, comprising electrolessly depositing a first metal containing layer on a doped silicon region on a surface of a substrate, forming a contact level interconnect feature, wherein the process of forming the contact level interconnect comprises depositing a dielectric layer over a surface of the substrate and the first metal containing layer, and forming one or more contact level features in the dielectric layer using conventional semiconductor processing methods, wherein the first metal containing layer is exposed at the bottom of one or more of the contact level features, depositing a barrier layer over the surface of the first metal layer, wherein the depositing the barrier layer comprises depositing a second metal layer over the first metal layer, wherein the second metal layer contains a metal selected from a group consisting of ruthenium (Ru), cobalt (Co), nickel (Ni), rhodium (Rh), iridium (Ir), palladium (Pd) and platinum (Pt), and electrolessly depositing a copper containing layer on the barrier layer.

Embodiments of the invention further provide a method for depositing a material on a contact level feature formed on a substrate, comprising providing a substrate that has one or more contact level features that have an exposed doped silicon containing region, depositing a first metal layer on the doped silicon containing region, depositing a barrier layer over the surface of the first metal layer, wherein the depositing the barrier layer comprises depositing a second layer over the first layer, wherein the second layer comprises ruthenium and tantalum, and filling the contact level feature with a metal containing layer.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

FIGS. 1A-1F illustrate schematic cross-sectional views of an integrated circuit formed by a process described in the art;

DETAILED DESCRIPTION OF THE PREFERRED EMBODIMENT

Embodiments of the invention generally provide methods of filling contact level features formed in a semiconductor device by depositing a barrier layer over the contact feature and then filing the layer using an PVD, CVD, ALD, electrochemical plating process (ECP) and/or electroless deposition processes. The term "barrier layer" as used herein is generally intended describe a single layer, or two or more layers, that act as an adhesion layer and a diffusion barrier for the subsequently deposited metal layer(s). In one embodiment, the barrier layer has a catalytically active surface that will allow the electroless deposition of a metal on the barrier layer. In one aspect, the electrolessly deposited metal is copper or a copper alloy. Copper alloys may be useful to improve the device speed and performance, help prevent electromigration or stress migration degradation during subsequent processing, improve the manufacturing device yield and device lifetime due to electromigration or stress migration limitations of copper or allow the deposited materials to diffuse to unwanted areas in the formed device. In one embodiment, a portion of the barrier layer is purposely allowed to react with traces of residual oxide at the silicon junction of the contact level feature to form a low resistance connection (e.g., silicide formation). One embodiment includes a method of filling a contact level feature with a copper alloy by use of an electroless deposition process. In another embodiment, a copper alloy is used to from a thin conductive copper layer that is used to subsequently fill features with a copper containing material by use of an electrochemical plating process (ECP), PVD, CVD, and/or ALD deposition process.

Electroless Fill Contact Formation Process

Figure 2A:
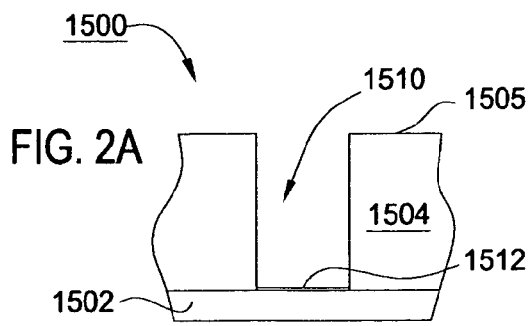
FIGS. 2A-2G illustrate schematic cross-sectional views of an contact level feature formed by a process described within an embodiment herein.
Figure 2B:
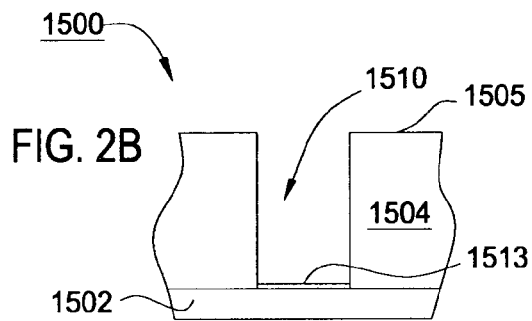
Figure 2C:
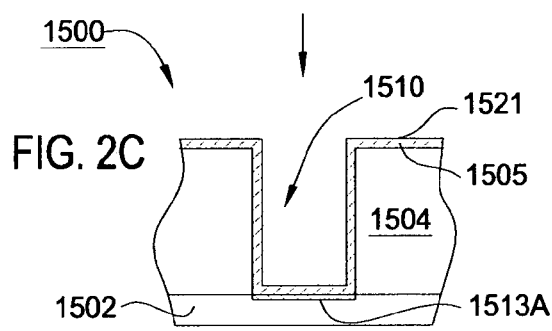
Figure 2D:
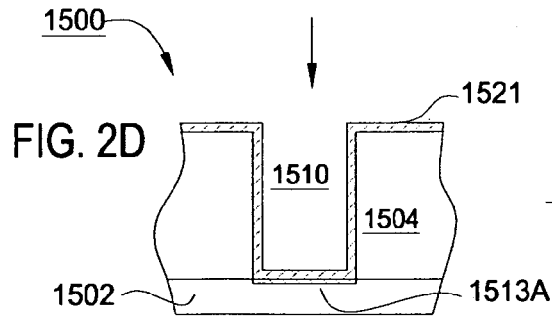
Figure 2F:
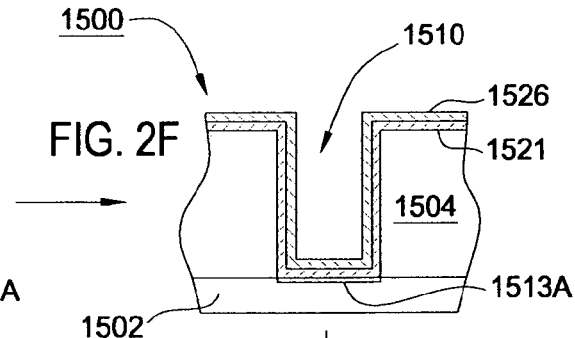
Figure 2E:
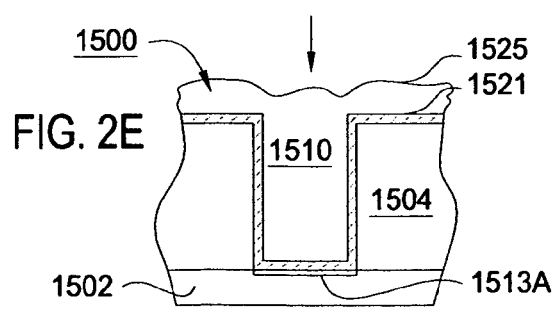
Figure 2G:
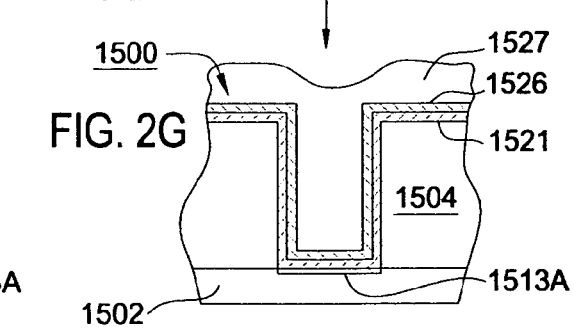
Figure 3:
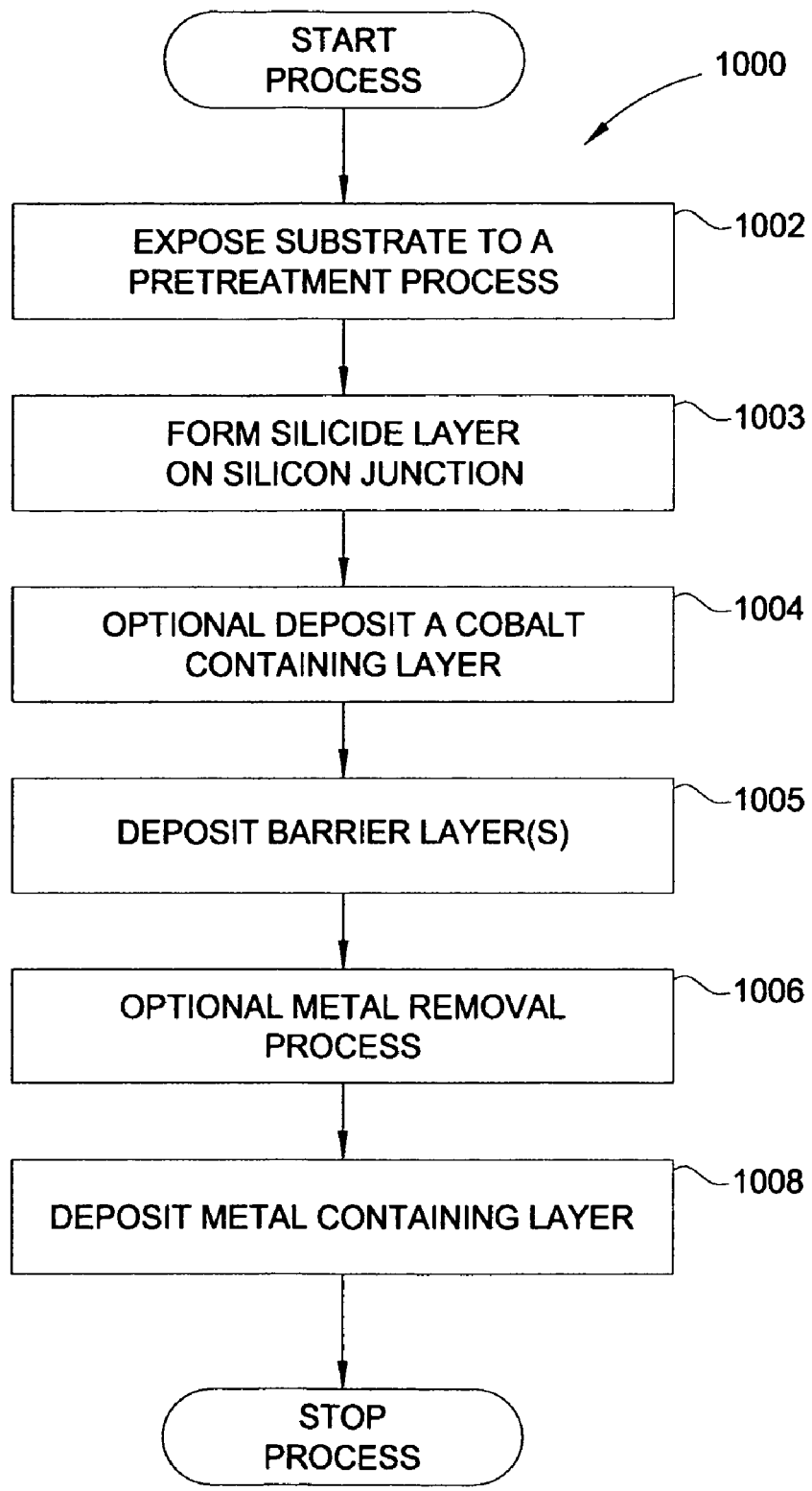
FIG. 3 is a flow chart depicting an deposition process as described within an embodiment herein.

The first novel method, illustrated in FIG. 3, is a series of method steps 1000 that are used to fill a contact level feature. FIG. 2A illustrates a cross-sectional view of substrate 1500 having a contact level aperture 1510 formed into dielectric layer 1504. The dielectric layer 1504 contains an insulating material that includes silicon dioxide, silicon nitride, SOI, silicon oxynitride and/or carbon-doped silicon oxides, such as $SiO_xC_y$, for example, BLACK DIAMOND™ low-k dielectric, available from Applied Materials, Inc., located in Santa Clara, Calif. Contact level aperture 1510 may be formed in dielectric layer 1504 using conventional lithography and etching techniques to expose the silicon junction 1502, such as a MOS type source or drain interface. Silicon junction 1502 is generally a doped silicon region formed in a silicon substrate, such as a n+ or p+ doped silicon region.

An oxide surface 1512 is usually formed at the silicon junction 1502 during previous etching and ashing processes used to form contact level aperture 1510. Oxide surface 1512 may be a continuous layer or a discontinuous layer across the surface of silicon junction 1502 and include a surface terminated with oxygen, hydrogen, hydroxides, a metal or combinations thereof. In examples wherein silicon junction 1502 contains a single crystal or polycrystalline silicon substrate the oxide surface 1512 is usually a silicon oxide surface. Also, where the silicon junction 1502 contains a doped layer and/or metal silicide formed on the surface, the oxide surface 1512 will generally contain metal oxides and silicon oxides present at the surface.

The first step of the method steps 1000 includes an optional pretreatment process step 1002, to remove the oxide layer so subsequent processes can be preformed on the surface of the silicon junction 1502. In this process step the substrate 1500 is exposed to a pretreatment process to form a treated surface (not shown) on the silicon junction 1502, which is substantially free of oxide surface 1512. The various processes that may be used to perform the pretreatment process step 1002 on the surface of the silicon junction 1502 include, but are not limited to wet-clean processes and plasma cleaning processes. Examples of various wet-clean processes that may be used to remove oxide surface 1512 are further described in the U.S. Provisional Application Ser. No. 60/709,564, filed Aug. 19, 2005, U.S. Provisional Application Ser. No. 60/703,538, filed Jul. 29, 2005, and U.S. Provisional Application Ser. No. 60/663,493, filed Mar. 18, 2005, which are all incorporated by reference herein in their entirety. A plasma cleaning processes may be performed using a vacuum preclean chamber, such as a Siconi Preclean chamber available from Applied Materials Inc. of Santa Clara, Calif.

The second step includes a silicide layer formation step 1003 that is used to form a metal layer 1513 over the silicon junction 1502. In general the metal layer 1513 contains a metal that forms a silicide (e.g., element 1513A in FIGS. 2C-2G) with the silicon material contained in the silicon junction 1502 during subsequent thermal processing steps. In general the deposited metal layer 1513 may contain one or more of the following elements nickel (Ni), titanium (Ti), tantalum (Ta), cobalt (Co), molybdenum (Mo) or tungsten (W). The metal layer 1513 may be selectively or non-selectively deposited using a conventional ALD or CVD deposition process. Also, the metal layer 1513 may be non-selectively deposited using a conventional PVD deposition process. Preferably, the metal layer 1513 is deposited using an electroless deposition process, such as the processes described in U.S. Provisional Patent Application Ser. No. 60/703,538, filed Jul. 29, 2005 and U.S. Provisional Patent Application Ser. No. 60/731,624, filed Oct. 28, 2005, which are herein incorporated by reference. In one embodiment, the metal layer 1513 is a nickel layer containing layer that has been deposited using an electroless deposition process. In one aspect, the metal layer 1513 when deposited is between about 5 and about 100 angstroms (Å) thick. Preferably, the metal layer 1513 is from about 10 Å to about 50 Å thick, and more preferably, from about 10 Å to about 30 Å. In one aspect, to achieve a contact resistance of 45 ohms at 50 nm plug with 5:1 aspect ratio a metal layer 1513 having a resistivity less than about 35 microohm-cm, and preferably less than about 10 microohm-cm, and more preferably less than about 5 microohm-cm.

In one aspect of the method steps 1000 (not shown in FIGS. 2A-2G or FIG. 3), the metal silicide layer 1513A is formed at the silicon junction 1502 by use of a thermal process, such as a conventional anneal or RTP process, prior to performing the subsequent method steps. Generally, the silicide formation process step is performed in a vacuum or inert environment to prevent the oxidation or damage to the surface of the metal silicide layer 1513A and contact level aperture 1510 surfaces. Typically, the metal silicide layer 1513A formed at the silicon junction 1502 is a nickel silicide, cobalt silicide, titanium silicide, molybdenum silicide, tungsten silicide, tantalum silicide, or other common metal silicides. In one aspect, where a nickel silicide layer is to be formed at the silicon junction 1502 the substrate may be heated to a temperature between about 300° C. and about 450° C. for a period of time that allows a silicide layer of a desired thickness and resistance to be formed. The silicide formation process step is used to reduce the contact resistance between the metal layers deposited in the contact level aperture 1510 and the silicon junction 1502.

In one embodiment of the method steps 1000 (not shown in FIG. 3), an optional cleaning process is performed on the surface of the formed metal silicide layer 1513A, or metal layer 1513, using a very dilute solution of hydrofluoric acid (HF) (e.g., 100:1 ratio of DI Water:HF) prior to depositing barrier layer 1521. The optional cleaning process step may be used to remove any surface oxides formed on the exposed surfaces of the metal silicide layer 1513A or metal layer 1513. The removal of these oxides can help reduce the contact resistance of the formed structure.

In one embodiment, a thin layer cobalt containing layer (step 1004 in FIG. 3) may be deposited over the metal silicide layer 1513A to inhibit the diffusion of the metal layer component(s) into the subsequently deposited layers or other contact level aperture 1510 elements. In one aspect, step 1004 is completed before the silicide layer formation step 1003 and thus is deposited directly on the metal layer 1513. In general the cobalt containing layer (not shown) is a binary alloy or ternary alloy, such as cobalt boride (CoB), cobalt phosphide (CoP), cobalt tungsten phosphide (CoWP), cobalt tungsten boride (CoWB), cobalt molybdenum phosphide (CoMoP), cobalt molybdenum boride (CoMoB), cobalt rhenium boride (CoReB), cobalt rhenium phosphide (CoReP), derivatives thereof, or combinations thereof. In one aspect, the cobalt containing layer (not shown) is between about 5 and about 100 angstroms (Å) thick. Preferably, the cobalt containing layer is from about 5 Å to about 50 Å thick, and more preferably, from about 10 Å to about 30 Å. Preferably, the cobalt containing layer is deposited using an electroless deposition process, such as the processes described in U.S. patent application Ser. No. 11/040,962, filed Jan. 22, 2005 and U.S. patent application Ser. No. 10/967,644, filed Oct. 18, 2004, which are herein incorporated by reference.

The third step includes a barrier layer deposition step 1005 that is used to form a barrier layer 1521 over the metal silicide layer 1513A. While the discussion below describes the deposition of the barrier layer 1521 over the metal silicide layer 1513A, this is not intended to be limiting as to processing sequence described herein since the thermal processes used to form the metal silicide layer 1513A may be performed after the barrier layer 1521 or other subsequent layers are formed. In general the barrier layer 1521 contains one or more layers of material that act as an adhesion layer and a diffusion barrier for the subsequently deposited metal layer 1525. In one aspect, the barrier layer 1521 is between about 5 and about 100 angstroms (Å) thick. Preferably, the barrier layer 1521 is from about 10 Å to about 50 Å thick, and more preferably, from about 10 Å to about 30 Å. In one embodiment, a portion of the barrier layer 1521 is selected so that it will react with traces of residual oxide at the silicon junction 1502 to further provide a low resistance connection to the metal silicide layer 1513A.

In one aspect, the exposed surface of the barrier layer 1521 may have a catalytically active surface for the subsequently deposited metal layers (e.g., metal layer 1525) using an electroless deposition process. For example, in some embodiments, it may be desirable to form a barrier layer 1521 that has an exposed surface layer that contains a group VIII metal, such as ruthenium (Ru), cobalt (Co), nickel (Ni), rhodium (Rh), iridium (Ir), palladium (Pd) or platinum (Pt) to serve as a catalytically active initiation and adhesion layer for the subsequently deposited metal layer 1525 (e.g., copper (Cu)).

The barrier layer 1521 may also contain one or more layers that contain titanium (Ti), titanium nitride (TiN), tantalum (Ta), tantalum nitride (TaN), tungsten (W), molybdenum (Mo), tungsten nitride (WN), tungsten carbon nitride (WCN), molybdenum carbon nitride (MoCN), tantalum carbon nitride (TaCN), titanium silicon nitride (TiSiN), or any other combinations thereof. The barrier layer deposition step 1005 may be performed by use of conventional PVD, CVD, plasma enhanced CVD (PECVD), ALD, plasma enhanced ALD (PEALD). In one aspect, a non-selective deposition process is used, such as a PVD, non-selective CVD, non-selective plasma enhanced CVD, non-selective ALD, and/or non-selective plasma enhanced ALD process(es). Examples of an exemplary CVD and ALD type deposition processes and hardware configuration are further described in the commonly assigned U.S. Pat. No. 6,951,804, the commonly assigned United States Patent Publication number 20030108674, the commonly assigned United States Patent Publication number 20050106865, and the commonly assigned United States Patent Application publication number 20030049931, which are all herein incorporated by reference.

In one aspect, the barrier layer 1521 is deposited in the barrier deposition step 1005 by use of a PVD deposition process that is used to deposit a layer that contains two or more elements, such as a ruthenium and tantalum alloy. Ruthenium and Tantalum alloys are useful, since it they have the combined benefits of blocking copper diffusion as effectively as conventional tantalum barrier layers and providing a suitable surface for direct electroless and/or electrochemical plating of a copper seed layer thereon. In general Ru—Ta alloys do not suffer from the same adhesion problems as found with conventional Ta and TaN barrier layers. Therefore, in one aspect of the invention, the barrier layer 1521 contains a Ru—Ta alloy that contains between about 70 atomic % and about 95 atomic % ruthenium and the balance tantalum. In another aspect, the barrier layer 1521 preferably contains a Ru—Ta alloy that contains between about 70 atomic % and about 90 atomic % ruthenium and the balance tantalum. In yet another aspect, the barrier layer 1521 more preferably contains a Ru—Ta alloy that contains between about 80 atomic % and about 90 atomic % ruthenium and the balance tantalum. In one aspect, it may be desirable to select a Ru—Ta alloy that does not contain regions of pure tantalum on the surface. In one aspect, a PVD type deposition process is used to deposit a barrier layer 1521 that contains the Ru—Ta alloy containing about 90 atomic % ruthenium and the balance tantalum (e.g., 0.9 Ru:0.1 Ta).

In one embodiment, a selective deposition process may be used, such as electroless, selective CVD, selective PECVD, selective ALD, and/or selective PEALD, to form a barrier layer 1521 that may only cover the exposed area(s) of the metal silicide layer 1513A. Also, one or more of the layers in the barrier layer 1521 may be selectively deposited by use of an electroless deposition process. The electroless deposition process may be used to form a layer that contains a binary alloy or ternary alloy, such as cobalt boride (CoB), cobalt phosphide (CoP), nickel boride (NiB), nickel phosphide (NiP), cobalt tungsten phosphide (CoWP), cobalt tungsten boride (CoWB), nickel tungsten phosphide (NiWP), nickel tungsten boride (NiWB), cobalt molybdenum phosphide (CoMoP), cobalt molybdenum boride (CoMoB), nickel molybdenum phosphide (NiMoB), nickel molybdenum phosphide (NiMoP), nickel rhenium phosphide (NiReP), nickel rhenium boride (NiReB), cobalt rhenium boride (CoReB), cobalt rhenium phosphide (CoReP), derivatives thereof, or combinations thereof. The film composition of the binary or ternary alloys can be preferably designed to have a resistivity in the range of about 1 to about 200 microohm-cm.

In one aspect, a nickel containing barrier layer 1521 is formed by performing two or more process steps which may include depositing a self-assembled-monolayer (SAM) material on to the surface of the substrate 1500 (e.g., covers field region 1505 and in the contact level aperture 1510) and then electrolessly depositing a nickel layer onto the deposited SAM layer. Examples of a prototypical SAM materials include, but are not limited to aminopropyltriethoxy silane (APTES) that may be deposited using a vapor phase deposition process. In one aspect, it may be desirable to perform a hydrogen and/or water containing plasma treatment process to the metal silicide layer 1513A, field region 1505 and contact level aperture 1510 prior to depositing the SAM layer to form a silanol (e.g., Si—OH) surface to promote the adhesion of the SAM layer. In one aspect, the hydrogen and/or water containing plasma treatment is used to perform the photoresist stripping process.

In another aspect, the barrier layer 1521 contains a multi-layer stack of materials that are deposited on the field region 1505 and in the contact level aperture 1510. Examples of multilayer stacks that may be used to form a barrier layer 1521 that has desirable diffusion barrier and contact resistance properties include, but are not limited to layers containing Ti/TiN/Ru, Ti/TiN/Co, Ti/TiN/Ni, Ti/Ru, Ta/Ru, TaN/Ru, Ni/Co, Ti/TiN/W/Ni, and Ti/TiN/W/Co. The nomenclature used herein to define a multilayer stack is intended to describe a barrier layer 1521 that contains discrete layers that may be arranged in a any desired order (e.g., Ni/Co=Ni on Co or Co on Ni) as long as the final exposed surface of the barrier layer 1521 is catalytically active to enable a subsequent electroless deposition process or can be readily rendered catalytically active by performing a activation process (e.g., palladium activation). For example, a Ti/TiN/Ru stack contains three layers, which are a titanium (Ti) containing layer, a titanium nitride (TiN) containing layer, and a ruthenium (Ru) containing layer (e.g., pure Ru, 0.9 Ru:0.1 Ta, etc.), that may be arranged so that the Ti containing layer is deposited on the metal silicide layer 1513A and then the TiN containing layer is deposited on the Ti layer and then the Ru containing layer is deposited over both layers. The multilayer stacks that may be used to form a barrier layer 1521 may be deposited by use of one or more conventional deposition techniques, such as PVD, CVD, PECVD, ALD, PEALD, ECP, or electroless deposition processes.

In yet another aspect, the barrier layer 1521 may contain a multilayer stack of metals, such as, Ti, TiN, Ti/TiN/W, Ti/TiN, Ti/W, Ta/TaN/W, Ta/W, Ni/W, and Co/W that have an additional catalytic layer deposited on the top surface so that an electroless layer can be deposited thereon. A typical catalytic layer that is deposited on these multilayer stacks may be a ruthenium (Ru), cobalt (Co), nickel (Ni), rhodium (Rh), iridium (Ir), palladium (Pd) or platinum (Pt) containing layer. The multilayer stacks that may be used to form a barrier layer 1521 may be deposited by use of one or more conventional deposition techniques, such as PVD, CVD, PECVD, ALD, PEALD, ECP, or electroless deposition processes.

In one embodiment, it may be desirable to deposit a single layer type barrier layer 1521 that contains a material, such as titanium, palladium, platinum or ruthenium prior to electrolessly depositing the subsequent metal layer(s) (e.g., metal layer 1525). In one example, the titanium (Ti) is deposited using a two step process that contains a preclean process step (e.g., performed in a Siconi, Preclean II or Preclean XT chambers available from Applied Materials, Inc. of Santa Clara, Calif.) and then PVD titanium deposition step using a Endura™ RTM PVD chamber, which are both available from Applied Materials, Inc. of Santa Clara, Calif. In another example, a ruthenium (Ru) and tantalum (Ta) alloy layer (e.g., 0.9 Ru:0.1 Ta) is deposited using a two step process that contains a preclean process step (e.g., Siconi) and then PVD ruthenium and tantalum alloy deposition step using a Endura™ RTM PVD chamber. In another example, a ruthenium (Ru) layer is deposited using a CVD, ALD or PEALD processes. In another example, the ruthenium layer is deposited by use of an electroless displacement plating process using a ruthenium chloride solution. In another example, a palladium (Pd) layer is deposited using either an ALD, PEALD, CVD, or PECVD process or by use of an electroless displacement plating process. The thickness and the choice of the type of material that may be used depends on the types subsequent processes performed on the formed device (e.g., thermal cycling) and the barrier properties of the material or the stack formed using the material.

In one embodiment, an optional metal removal step 1006 may be added to the method steps 1000 to remove any deposited barrier layer 1521 from the field region 1505 (FIGS. 2A-B) by use of a wet clean process, CMP process, electrochemical process or other comparable material removal processes. A CMP process may be performed using a Reflexion™ CMP system available from Applied Materials Inc. of Santa Clara, Calif.

In the deposit a metal alloy layer step 1008, a metal layer 1525 is deposited so that it fills the contact level aperture 1510. In one aspect, this process is performed using an electroless deposition process. In general the contact level aperture 1510 can be filled with a metal, such as copper (Cu), nickel (Ni), cobalt (Co), ruthenium (Ru), tungsten (W) or combinations thereof. In one embodiment, the metal layer 1525 is formed by use of a metal layer electroless deposition solution (discussed below) that contains only a copper ion source and a reducing agent that allows the deposition of copper.

In another embodiment, metal layer 1525 is formed by use of metal layer electroless deposition solution (discussed below) that contains two or more metal ion sources and a reducing agent that allows the co-deposition of two or more metals. In one aspect, one of the metals ions is a copper ion and the other metal ion(s) are a metal selected from a group consisting of aluminum (Al), indium (In), molybdenum (Mo), tungsten (W), manganese (Mn), cobalt (Co), tin (Sn), nickel (Ni), magnesium (Mg), rhenium (Rh), beryllium (Be), phosphorus (P), boron (B), gallium (Ga), or ruthenium (Ru). In one aspect, a metal alloying element that is more electropositive than copper may be beneficial to improve the oxidation resistance and corrosion resistance of the deposited film. The addition of the alloying element will also generally improve the stability of the formed device by reducing the ability of some of the elements in deposited layer to rapidly diffuse into silicon or the silicon oxides. Examples of various chemistries that may be used to form the metal layer 1525 are further described below. In this configuration the electrical resistance of the electrical connection formed using method steps 1000 will be reduced, since a significant part, or volume, of the contact level aperture 1510 will contain predominantly copper, or a copper containing alloy, that has a resistivity lower than a conventional tungsten plug. The use of a metal layer 1525 is advantageous since by the selection of a desirable elements, such as a copper aluminum alloy, copper indium alloy, copper manganese alloy, a copper tungsten alloy, or a copper molybdenum alloy, to name just a few, the resistance of the formed connection will be reduced versus a conventional tungsten plug, and the metal alloy will have better electromigration performance than pure copper and/or diffusion resistance. It should be noted that the term "alloy" as used herein is not intended to be limited to the case of where one element forms a bond or compound with another element, and is intended to generally describe a film that contains a percentage of two or more elements. In one example, one of the elements may be positioned in an interstitial site or be deposited on the grain boundaries of a formed crystalline or amorphous structure containing a second element (e.g., Cu), rather than form a compound containing two or more elements. Further, in one aspect of the invention, due to the addition of the alloying element to copper, the copper atoms in the formed copper containing layer become less mobile thus reducing, or possibly eliminating the need for the barrier layer 1521. Thus, in some cases by adding an alloying element to a metal, such as copper will tend prevent or inhibit the metal from diffusing into unwanted areas of the formed device. In one aspect, it may be desirable to have the second metal ion source (i.e., metal ion other than copper ions) in the metal layer electroless deposition solution because the second ion is better suited to form an adhesion promoting interface between the barrier layer 1521 and the growing alloy layer (i.e., element 1525 and 1526).

In another embodiment of the deposit a metal alloy layer step 1008, the metal layer 1525 is formed using a metal layer electroless deposition solution that contains one or more metal ion sources and a reducing agent that allows the co-deposition of two or more metals. In one aspect, one of the metals ions is a cobalt or nickel based alloy can be deposited on top of these materials by electroless process. For example, the cobalt or nickel based alloys may be a binary alloy or ternary alloy, such as cobalt boride (CoB), cobalt phosphide (CoP), nickel boride (NiB), nickel phosphide (NiP), cobalt tungsten phosphide (CoWP), cobalt tungsten boride (CoWB), nickel tungsten phosphide (NiWP), nickel tungsten boride (NiWB), cobalt molybdenum phosphide (CoMoP), cobalt molybdenum boride (CoMoB), nickel molybdenum phosphide (NiMoP), nickel molybdenum boride (NiMoB), nickel rhenium phosphide (NiReP), nickel rhenium boride (NiReB), cobalt rhenium boride (CoReB), cobalt rhenium phosphide (CoReP), derivatives thereof, or combinations thereof. The selection of materials used to form the metal layer 1525 is influenced by the resistivity of the films deposited. In one aspect, all the deposited films are pure metals and thus their resistivity is less than about 10 microohms-cm, and more preferably less than about 5 microohms-cm. In another aspect, a stack of discrete metal layers having different thickness may be used to form a device that has good diffusion barrier properties as well as lower overall contact resistance of the device.

Second Contact Fill Formation Process

Figure 4:
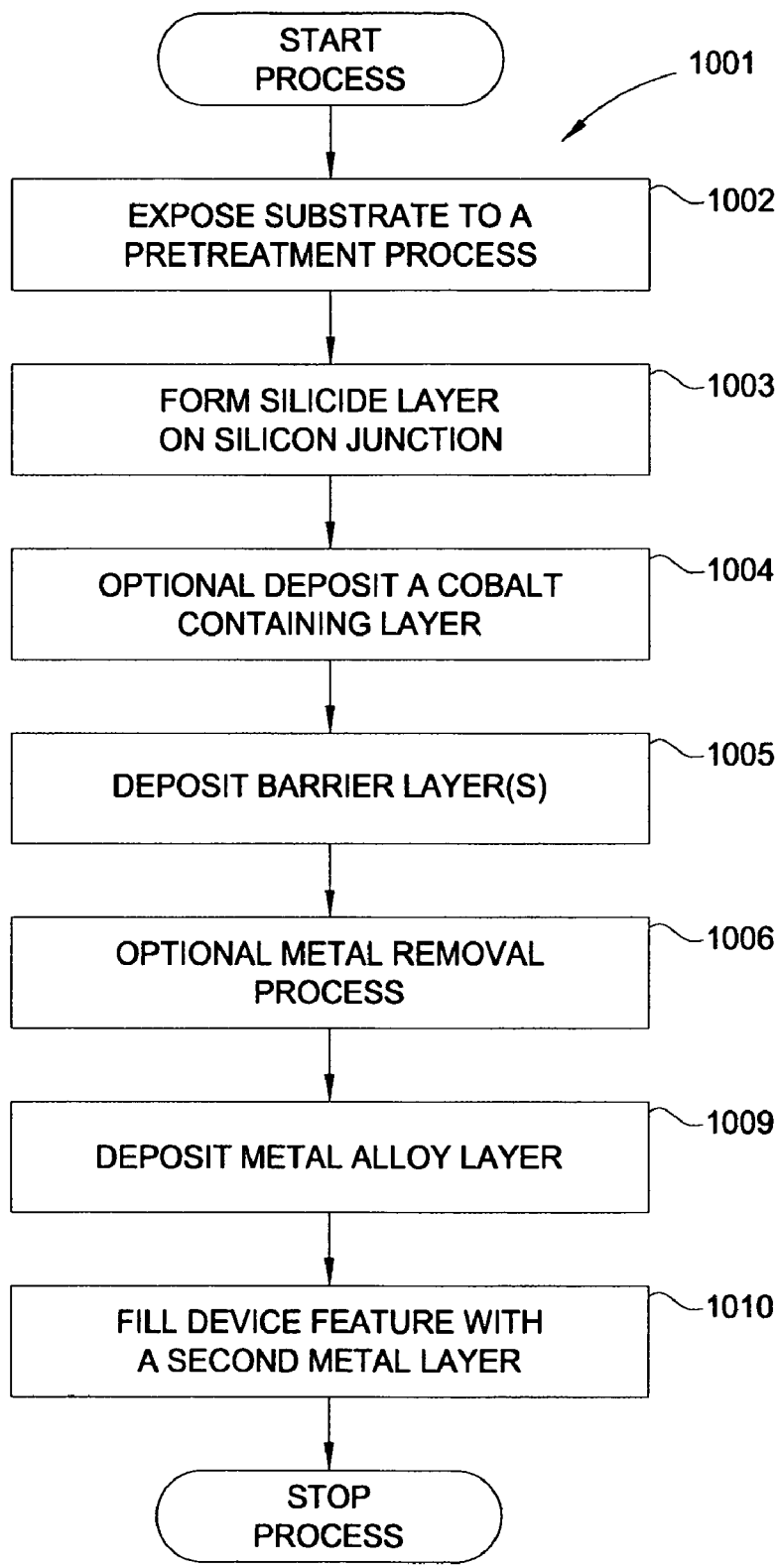
FIG. 4 is a flow chart depicting a deposition process as described within an embodiment herein.

Another novel method of filling a contact level feature is illustrated in FIGS. 2A-2D, 2F-2G and 4. FIG. 4 illustrates is a series of method steps 1001 that are used to fill a contact level feature. The steps 1002-1006 in the method steps 1001 are generally the same as the method steps 1000 and thus are not recited below. The method steps 1001 differ from the method steps 1000, described above, due to the variation of only depositing a thin metal layer 1526 (step 1009 in FIG. 4) and then filling the contact level aperture 1510 with a second metal layer 1527 (step 1010 in FIG. 4).

In one embodiment of the method steps 1001, after performing steps 1002-1006, the step 1009 is performed to deposit a thin metal layer 1526 on the field region 1505 and in the contact level aperture 1510. Step 1009 is similar to step 1008 described above in conjunction with FIG. 3, except that the thin metal layer 1526 is formed rather than filling the contact level aperture 1510. Therefore, as noted above the metal layer 1526 will contain one or more metal elements that are deposited using an electroless deposition process that utilizes the metal layer electroless deposition solution (discussed below). The use of an electroless deposition process may be especially useful due to the deposition of a conformal coating having a uniform thickness formed over the contact level aperture 1510. In one aspect, electrolessly deposited films are preferred, since they generally do not contain the amount of carbon that CVD and ALD deposited films contain from the incorporation of the CVD or ALD precursor materials in the deposited film. The incorporation of carbon in the deposited film will affect the resistivity and adhesion of the deposited layer to prior or subsequently deposited layers. Electrolessly deposited films may also be favored over PVD deposited films, because a thin or discontinuous PVD deposited layer will be formed in typical $\leq 45$ nm type features due to the fact that it is a line-of-sight type deposition process. Electroless deposition processes are also useful to form metal layers that have two or more metal components contained therein. In one aspect, it may be desirable to varying composition of the electrolessly deposited layer that contains two or more metal components. An exemplary process and hardware that may be used to form a metal layer having a varying composition is described in the commonly assigned U.S. patent application Ser. No. 11/040,962, filed Jan. 22, 2005, which is incorporated by reference herein in its entirety.

In one aspect, the thin metal layer 1526 is thick enough to reduce the terminal effect of the subsequently deposited second metal layer 1527 by use of an electrochemical plating process (ECP). In another aspect, the thin metal layer 1526 is thick enough to reduce or inhibit the diffusion of the material in the subsequently deposited second metal layer 1527 into the silicon junction 1520, or adjacent devices elements, and prevent diffusion of silicon in the silicon junction 1520 from diffusing into the second metal layer 1527. In one aspect, the thin metal layer 1526 is deposited to a thickness between about 10 Å and about 100 Å. In general, ECP deposition processes have advantages over CVD, ALD and PVD type processes, since the selection of the electrolyte components (e.g., additives, acid concentration) and various process recipe parameters (e.g., current density) apertures of varying sizes can be filled without forming voids or gaps in the deposited layer or incorporating carbon in the deposited film. Examples of exemplary electrochemical deposition processes and hardware configuration are further described in the commonly assigned U.S. Pat. No. 6,596,151, and the commonly assigned copending U.S. patent application Ser. No. 10/854,006, filed May 25, 2004 and U.S. patent application Ser. No. 10/616,284, filed Jul. 28, 2003, which are all herein incorporated by reference.

In step 1010, a second metal layer 1527 is deposited on the thin metal layer 1526 to fill the contact level aperture 1510. In one embodiment, the second metal layer 1527 may be a metal alloy that contains one or more elements, such as copper (Cu), aluminum (Al), indium (In), molybdenum (Mo), tungsten (W), manganese (Mn), cobalt (Co), rhenium (Rh), ruthenium (Ru), or combinations thereof. In another embodiment, the second metal layer 1527 is a pure copper (Cu) layer. The second metal layer 1527 may be deposited by any conventional deposition technique, such as PVD, CVD, PECVD, ALD, PEALD, ECP, or electroless deposition processes. In general, the material from which the second metal layer 1527 is formed is selected so that it has a high electrical conductivity to reduce the overall resistance of the circuit formed using the contact level aperture 1510.

The formed device feature using the method steps 1001 may be advantageous since it combines the use of a thin metal layer 1526 and high conductivity second metal layer 1527 to form a device feature that has a lower resistivity than conventional tungsten deposited materials, while also inhibiting the diffusion of the second metal layer 1527 to unwanted regions of the device due to the barrier-like properties of the thin metal layer 1526.

Third Contact Fill Formation Process

Figure 5A:
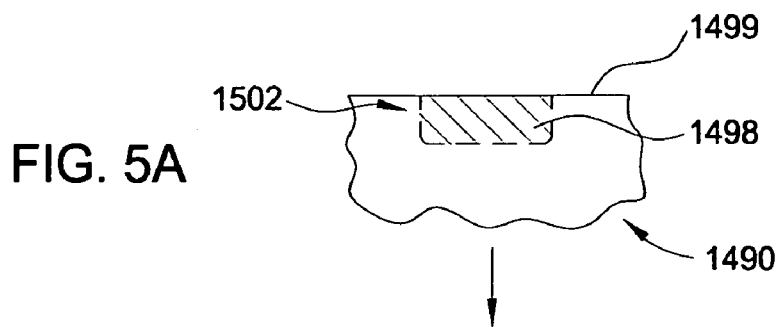
FIGS. 5A-5D illustrate schematic cross-sectional views of an contact level feature formed by a process described within an embodiment herein.
Figure 5B:
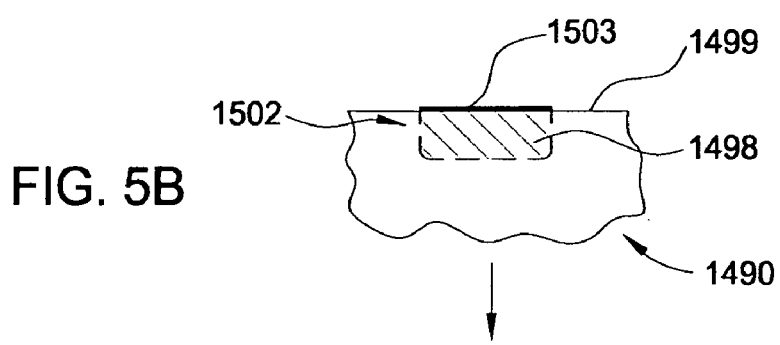
Figure 5C:
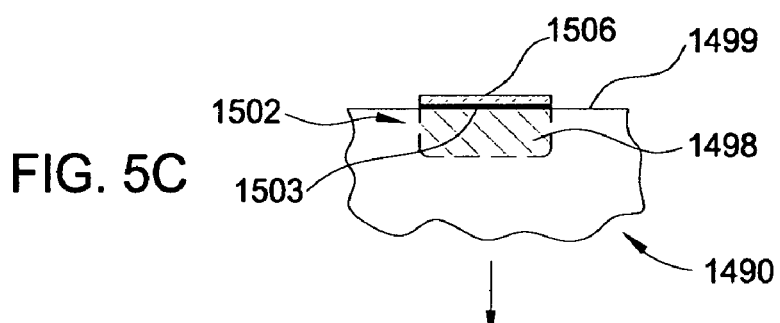
Figure 5D:
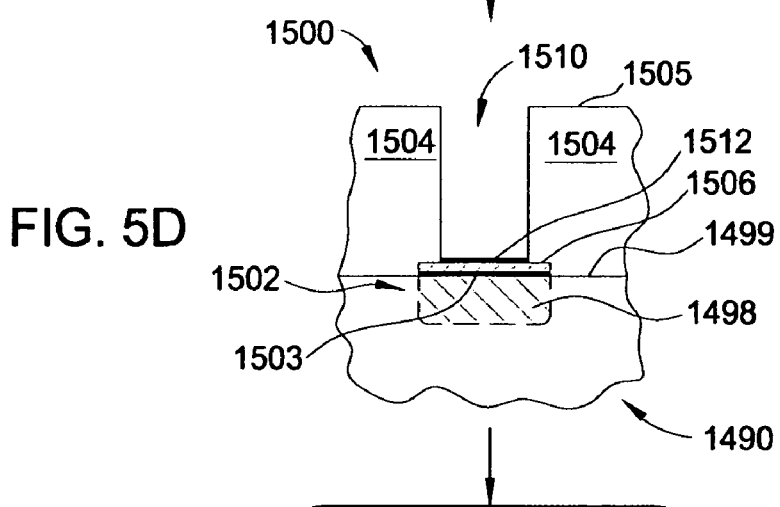
Figure 6:
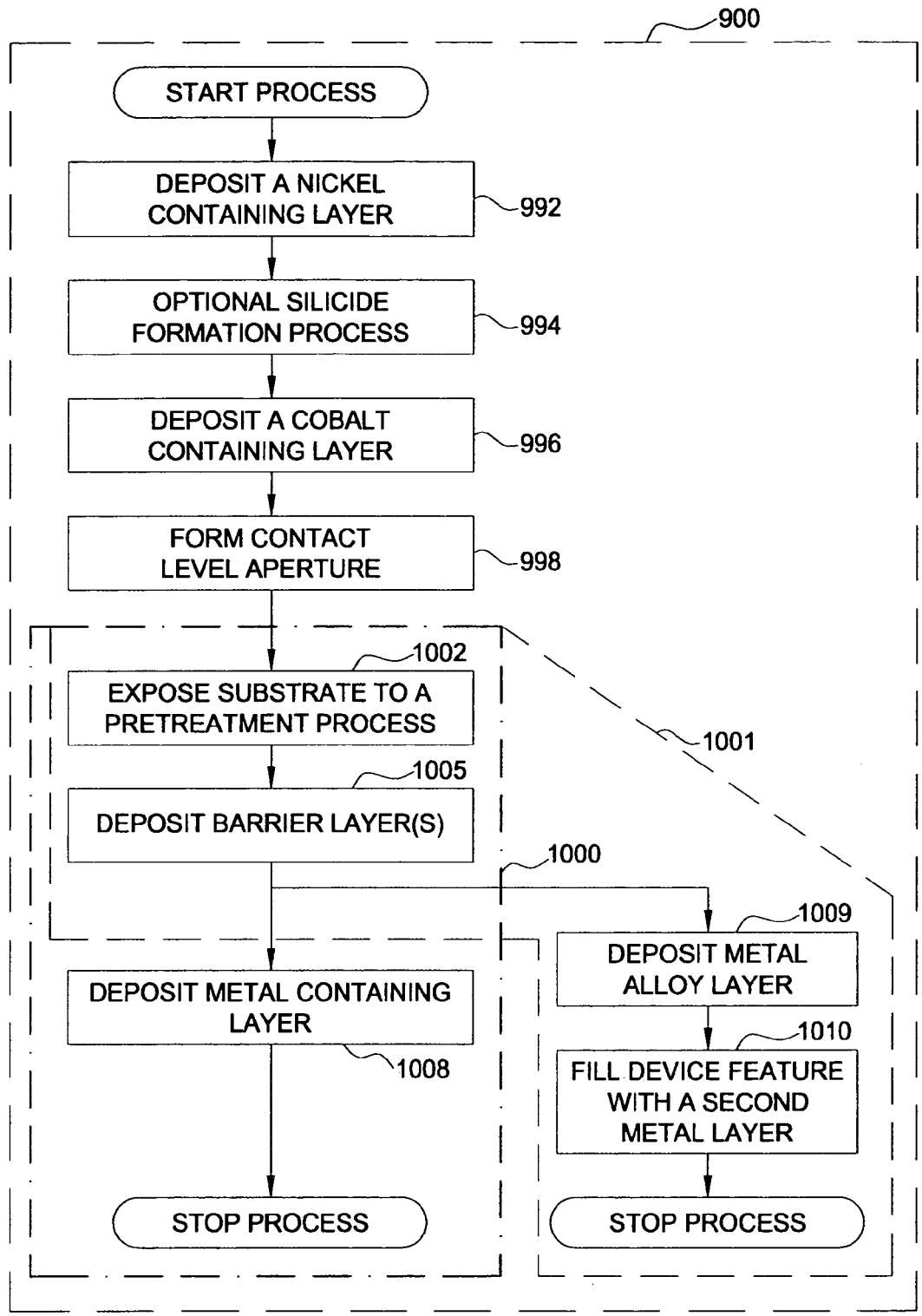
FIG. 6 is a flow chart depicting a deposition process as described within an embodiment herein.

Another novel method of filling a contact level feature is illustrated in FIGS. 5A-5F and 6. FIG. 6 illustrates is a series of method steps 900 that are used to fill a contact level feature (e.g., contact level aperture 1510) using the methods described in methods steps 1000 or 1001, plus some additional preprocessing steps 992-998. The steps 1002, 1005, 1008, 1009 and 1010 in the method step 900 are generally the same as the steps contained in the method steps 1000 or 1001 and thus are not recited below. One will note that the silicide layer formation step 1003, the optional deposit a cobalt containing layer step 1004, and the optional metal removal step 1006 found in method steps 1000 and 1001 have been removed, since they are performed at different stages of the process sequence or they are may not be required. FIG. 5A illustrates a silicon junction 1502 formed on a substrate 1490, wherein the silicon junction 1502 generally contains a doped silicon region 1498 that has an exposed surface 1499 on which the subsequent process steps will be performed.

Referring to FIGS. 5B and 6, in the deposit a metal containing layer step 992, or the first step of the method steps 900, a metal containing layer 1503 is deposited on the doped silicon region 1498 of the substrate 1490. In one embodiment, the metal containing layer 1503 is deposited using an electroless deposition process. For example, an electroless deposition process may be used to deposit a nickel containing layer on the doped silicon region 1498. An exemplary electroless nickel deposition process is further described in the commonly assigned U.S. Provisional Patent Application Ser. No. 60/703,633, filed Jul. 29, 2005, the commonly assigned U.S. Provisional Patent Application Ser. No. 60/703,538, filed Jul. 29, 2005, the commonly assigned U.S. Provisional Application Ser. No. 60/709,564, filed Aug. 19, 2005, and the commonly assigned U.S. Provisional Patent Application Ser. No. 60/663,493, filed Mar. 18, 2005, which are all incorporated by reference herein in their entirety.

Referring to FIGS. 5D and 6, in the form the contact level aperture step 998 a contact level aperture 1510 is formed over the metal containing layer 1503 and the optional cobalt containing layer 1506 using conventional dielectric deposition, lithography and etching techniques. After step 998 is completed then the barrier deposition step 1002 can performed following the methods described in FIG. 3 or 4.

EXAMPLE

Nickel Electroless Chemistry

In one example, an electroless solution contains: nickel sulfate with a concentration of about 60 mM; dimethylaminoborane (DMAB) in a concentration of about 14 mM; citric acid in a concentration of about 60 mM; diethanolamine (DEA) in a concentration of between about 33 mM and about 115 mM; glycine in a concentration between about 5 mM to about 50 mM; boric acid in a concentration between about 5 mM and about 10 mM; lactic acid in a concentration of about 120 mM; tetramethyl ammonium hydroxide (TMAH) in a concentration to adjust the electroless solution to a have pH value in a range from about 8 to about 11, preferably from about 9 to about 10, and more preferably from about 8.0 to about 8.5, such as about 8.5. The electroless deposition process may be conducted at a temperature in a range from about 35° C. to about 120° C., preferably from about 80° C. to about 85° C. The water may be degassed, preheated and/or deionized water. Degassing the water reduces the oxygen concentration of the subsequently formed electroless solution. An electroless solution with a low oxygen concentration (e.g., less than about 100 ppm) may be used during the deposition process. Preheated water allows forming the electroless solution at a predetermined temperature just below the temperature used to initiate the deposition process, thereby shortening the process time.

Referring to FIG. 6, next an optional silicide formation process step 994, is used to reduce the contact resistance between the metal containing layer 1503 deposited on the surface 1499 of the doped silicon region 1498 by causing the deposited metal containing layer 1503 to form a nickel silicide ($Ni_xSi_y$). The metal containing layer 1503 formed in step 992 should have a sufficient thickness to form a good electrical contact (e.g., ohmic contact) between the subsequently deposited layers (e.g., barrier layer 1521) and the doped silicon region 1498 in the silicon junction 1502. Typical silicide formation processes include heating a substrate 1490 to a temperature that will cause the nickel in the metal containing layer 1503 to form a nickel silicide. Generally, the silicide formation process step 994 is performed in a vacuum or inert environment to prevent the oxidation of the surface of the metal containing layer 1503.

Referring to FIGS. 5C and 6, in the optional deposit a cobalt containing layer step 996, a cobalt containing layer 1506 is deposited on the metal containing layer 1503. In one embodiment, step 996 is used to form a cobalt alloy layer, such as CoB, CoP, CoWP, CoWB, CoMoP, CoMoB, CoReB, or CoReP using electroless deposition techniques further described in the copending U.S. Provisional Patent Application Ser. No. 60/703,538, filed Jul. 29, 2005, the copending U.S. patent application Ser. No. 11/040,962, filed Jan. 22, 2005, the copending U.S. patent application Ser. No. 10/967,644, filed Oct. 15, 2004, and the copending U.S. patent application Ser. No. 10/967,919, filed Oct. 18, 2004, which are all incorporated by reference herein in their entirety. The addition of the cobalt containing layer 1506 layer over the metal containing layer 1503 will help to isolate the nickel silicide layer formed during step 994 from being attacked during the subsequent deposition dielectric etch step(s) (e.g., step 998).

Examples

Cobalt Electroless Chemistries

In one aspect, an electroless solution for depositing cobalt boride contains: cobalt ions ($Co^{2+}$) with a concentration in a range from about 1 mM to about 100 mM, preferably from about 5 mM to about 50 mM, and more preferably from about 10 mM to about 20 mM, such as about 15 mM; DMAB with a concentration in a range from about 1 mM to about 200 mM, preferably from about 10 mM to about 100 mM, and more preferably from about 30 mM to about 50 mM, such as about 40 mM; citric acid or citrate salt with a citrate concentration in a range from about 5 mM to about 500 mM, preferably from about 30 mM to about 300 mM, and more preferably from about 50 mM to about 150 mM, such as about 100 mM; and an optional pH adjusting agent (e.g., TMAH) with a concentration to adjust the electroless solution to a have pH value in a range from about 8 to about 11, preferably from about 8 to about 10, and more preferably from about 8.5 to about 9.5, such as about 8.9. The electroless deposition process to deposit cobalt boride may be conducted at a temperature within a range from about 35° C. to about 100° C., preferably from about 60° C. to about 80° C., and more preferably from about 65° C. to about 75° C., such as about 70° C.

In one aspect, an electroless solution for depositing metallic cobalt contains: cobalt ions ($Co^{2+}$) with a concentration in a range from about 1 mM to about 100 mM, preferably from about 5 mM to about 50 mM, and more preferably from about 10 mM to about 20 mM, such as about 15 mM; hydrazine hydrate with a concentration in a range from about 100 mM to about 2 M, preferably from about 200 mM to about 1 M, and more preferably from about 300 mM to about 700 mM, such as about 500 mM; citric acid or citrate salt with a citrate concentration in a range from about 5 mM to about 200 mM, preferably from about 10 mM to about 100 mM, and more preferably from about 30 mM to about 70 mM, such as about 50 mM; and an optional pH adjusting agent (e.g., TMAH) with a concentration to adjust the electroless solution to a have pH value in a range from about 10 to about 14, preferably from about 11.5 to about 13, and more preferably from about 12.2 to about 12.8, such as about 12.5. In one example, a pH value is about 11.5 or higher, preferably, about 12.0 or higher, and more preferably, about 12.5 or higher. The electroless deposition process to deposit metallic cobalt may be conducted at a temperature within a range from about 35° C. to about 100° C., preferably from about 60° C. to about 90° C., and more preferably from about 70° C. to about 80° C., such as about 75° C.

The "water" component used in any of the above examples may be degassed, preheated and/or deionized water. Degassing the water reduces the oxygen concentration of the subsequently formed electroless solution. An electroless solution with a low oxygen concentration (e.g., less than about 100 ppm) may be used during the deposition process. Preheated water allows forming the electroless solution at a predetermined temperature just below the temperature used to initiate the deposition process, thereby shortening the process time.

Metal Layer Electroless Deposition Solution(s)

In one aspect, the metal layer electroless deposition solution, which is used to form the metal layer 1525 or thin metal layer 1526 generally contains two metal ion sources and reducing agent that is used to form a high conductivity metal alloy layer. In one embodiment, one of the metal ion sources is copper ion that is added to the metal layer deposition solution.

In one embodiment, the metal layer electroless deposition solution is an aqueous solution that may contain a copper source, a second metal ion source, a reductant, a complexing agent, and a pH adjusting agent. The copper ion source within the metal layer electroless deposition solution may have a concentration in a range from about 5 mM to about 100 mM, preferably from about 25 mM to about 75 mM. Copper sources provide copper ions (e.g., $Cu^{1+}$ or $Cu^{2+}$) dissolved within the electroless solution to be reduced out as the deposited copper-containing material. Useful copper sources include copper sulfate, copper chloride, copper acetate, copper phosphate, copper pyrophosphate, copper fluoroborate, copper formate, derivatives thereof, hydrates thereof or combinations thereof.

In one embodiment, the metal layer electroless deposition solution contains a copper ion source and a second ion source that is an aluminum ion source, to form a metal layer that contains predominantly copper and small amounts of aluminum. Sources of aluminum that can be added to the metal layer electroless deposition solution may be aluminum ammonium sulfate ($AlNH_4(SO_4)_2 \cdot 12H_2O$), potassium alum dodecahydrate ($AlK(SO_4)_2 \cdot 12H_2O$), aluminum sulfate hexadecahydrate ($Al_2(SO_4)_3 \cdot 16H_2O$), derivatives thereof, or combinations thereof. In one embodiment, the metal layer electroless deposition solution contains about 7 grams/liter of a copper sulfate ($CuSO_4$) and between about 0.5 grams/liter and about 6 grams/liter of aluminum ammonium sulfate. In another embodiment, the metal layer electroless deposition solution contains a copper ion source and a second ion source that is an indium ion source, to form a metal layer that contains predominantly copper and small amounts of indium. Typical sources of indium that can be added to the metal layer electroless deposition solution may be indium(III)sulfate hydrate ($In_2(SO_4)_3 \cdot xH_2O$) and Indium(III) nitrate hydrate (In $(NO_3)_3 \cdot xH_2O$), derivatives thereof, or combinations thereof. In yet another embodiment, the metal layer electroless deposition solution contains a copper ion source and a second ion source that is a tungsten ion source, to form a metal layer that contains predominantly copper and small amounts of tungsten. The tungsten source may include various tungstate salts, such as ammonium tungstate (($NH_4)_2WO_4$), or other $WO_4^{2-}$ sources, derivatives thereof and/or combinations thereof. In yet another embodiment, the metal layer electroless deposition solution contains a copper ion source and a second ion source that is a molybdenum ion source, to form a metal layer that contains predominantly copper and small amounts of molybdenum. A typical molybdenum source is molybdenum sulfate. In yet another embodiment, the metal layer electroless deposition solution contains a copper ion source and a second ion source that is a magnesium ion source, to form a metal layer that contains predominantly copper and small amounts of magnesium. The magnesium sources may include magnesium sulfate, magnesium acetate tetrahydrate (($CH_3COO)_2Mg \cdot 4H_2O$), manganous sulfate, manganous acetate, manganous trifluoroacetate or other $Mg^{2+}$ sources, derivatives thereof, or combinations thereof. In yet another embodiment, the metal layer electroless deposition solution contains a copper ion source and a second ion source that is a beryllium ion source, to form a metal layer that contains predominantly copper and small amounts of beryllium. The beryllium sources may include beryllium sulfate or other $Be^{2+}$ sources, derivatives thereof, or combinations thereof. In yet another embodiment, the metal layer electroless deposition solution contains a copper ion source and a second ion source that is a titanium ion source, to form a metal layer that contains predominantly copper and small amounts of titanium. The titanium sources generally include ion sources that contain $Ti^{3+}$ and $Ti^{2+}$ complexes. In yet another embodiment, the metal layer electroless deposition solution contains a copper ion source and a second ion source that is a gallium ion source, to form a metal layer that contains predominantly copper and small amounts of gallium. The gallium sources may include gallium sulfate or other $Ga^{1+}$, Ga2+, or Ga+3 sources. In yet another embodiment, the metal layer electroless deposition solution contains a copper ion source and a second ion source that is a boron ion source, to form a metal layer that contains predominantly copper and small amounts of boron. The boron sources may include tetramethylammonium borohydride or dimethylaminoborane (DMAB). In yet another embodiment, the metal layer electroless deposition solution contains a copper ion source and a second ion source that is a phosphorous ion source, to form a metal layer that contains predominantly copper and small amounts of phosphorus. The phosphorus sources may include a hypophosphite salt such as tetramethylamonium hypophosphite or ammonium hypophosphite. In yet another embodiment, the metal layer electroless deposition solution contains a copper ion source and a second ion source that is a tin ion source, to form a metal layer that contains predominantly copper and small amounts of tin. The tin sources may include tin sulfate ($SnSO_4$) or other $Sn^{2+}$ or $Sn^{4+}$ sources.

The reducing agent, or reductant, within the metal layer electroless deposition solution may have a concentration in a range from about 10 mM to about 2 M, preferably from about 20 mM to about 500 mM. Reductants provide electrons to induce chemical reduction of the metal ions that form and deposit the metal alloy, which in one embodiment is a copper-containing alloy material. Reductants may include organic reductants (e.g., formaldehyde or glyoxylic acid), hydrazine, organic hydrazines (e.g., methyl hydrazine), hypophosphite sources (e.g., hypophosphorous acid ($H_3PO_2$), ammonium hypophosphite (($NH_4)_{4-x}H_xPO_2$) and salts thereof), borane sources (e.g., dimethylamine borane complex (($CH_3)_2NH \cdot BH_3$), DMAB), trimethylamine borane complex (($CH_3)_3N \cdot BH_3$), TMAB), tert-butylamine borane complex ($^tBuNH_2 \cdot BH_3$), tetrahydrofuran borane complex ($THF \cdot BH_3$), pyridine borane complex ($C_5H_5N \cdot BH_3$), ammonia borane complex ($NH_3 \cdot BH_3$), borane ($BH_3$), diborane ($B_2H_6$), tetraethylammonium borohydride ($(C_2H_5)_4N(BH_4)$), derivatives thereof, complexes thereof or combinations thereof. In one embodiment, the metal layer electroless deposition solution contains glyoxylic acid in a range between about 5 g/L and about 30 g/L. In another embodiment, the formulation may also contain formate ion, generated as by the neutralization of formic acid or simply by the use of cupric formate at the copper precursor.

In one embodiment, it is desirable to form an electroless plating solution that is optimized to perform a single wafer puddle plating process. Single use electroless puddle plating processes have advantages over re-circulating electroless deposition processes, since the deposition rate can be made more aggressive (i.e., higher deposition rate) without the issue of particle growth in the electroless plating solution or wafer-to-wafer electrolyte solution variation due to bath depletion. To meet the current cost-of-ownership (CoO) requirements, much higher deposition rate are required when performing electroless deposition fill processes. One such chemistry that can be used to obtain high deposition rates is a formulation such as, the novel copper formulation described below.

Polymeric additives are generally added to the metal layer electroless deposition solution to suppress the metal deposition on the field region (e.g., item 1505 FIG. 2C) by initially adsorbing onto underlying catalytic surfaces (e.g., barrier layer 1521) and therefore suppressing the rate of deposition. An exemplary polymeric additive, due to its size (e.g., molecular weight), will generally have a limited ability to diffuse into and thus inhibit the growth of the deposited film in the recess of the contact level aperture 1510, but will be able to suppress the growth of the deposited film on the field region. The polymeric additives may have a concentration in a range from about 0.5 parts-per-million (ppm) to 500 ppm. In one aspect, the polymeric additives generally include poly(4-ammonium styrenesulfonic acid), poly(acrylic acid-co-maleic acid), 4-vinylphenol-co-hydroxyethyl methacrylate, Poly(acrylic acid-coacrylamide) potassium salt, Poly[2,6-bis (hydroxymethyl)-4-methylphenol-co-4-hydroxybenzoic acid], Poly(acrylamide-codiallyldimethylammonium chloride), Poly(vinylpyridine), Poly(2-acrylamido-2-methyl-1-propanesulfonic acid), Poly(anilinesulfonic acid), Poly(4-vinylphenol), derivatives thereof, and/or combinations thereof.

In one embodiment, additives such as polyethylene glycol (PEG), polypropylene glycol (PPG), polyoxyethylene-polyoxypropylene copolymer (POCP), benzotriazole (BTA), dipyridyl, dimethyl dipyridyl, derivatives thereof or combinations thereof are added to metal layer electroless deposition solution. The additives, or "suppressors," can be added to the electroless deposition solution in a concentration in a range between about 20 ppb and about 600 ppm. In another aspect, a PEG type additive is added in a concentration range of about 0.05 to about 1 g/l.

In one aspect, one or more of the following chelators or complexing agents, may also be added to the metal layer electroless deposition solution which include: amino acids, carboxylic acids, dicarboxylic acids, polycarboxylic acids, amino acids, amines, diamines, polyamines, alkylamines, alkanolamines and alkoxyamines. The additional complexing agents may have a concentration in a range from about 10 mM to about 2 M, preferably from about 20 mM to about 300 mM. Complexing agents may include, but are not limited to citric acid, citrates, glycolic acid, glycine, malonic acid, maleic acid, lactic acid, ethylenediaminetetraacetic acid (EDTA), ethylenediamine (EDA), triethylene tetramine (TETA), diaminoethane, monoethanolamine, diethanolamine (DEA), triethanolamine (TEA), hydroxylamine hydrochloride, and ammonia, derivatives thereof, salts thereof or combinations thereof.

In one embodiment, the metal layer electroless deposition solution contains EDTA in a ratio relative to copper that is less than about 6:1 (e.g., EDTA concentration to Cu concentration), and more preferably at a ratio of about 2:1. In one embodiment, the EDTA concentration in the metal layer electroless deposition solution is in a range between about 5 g/L and about 30 g/L, and the copper concentration is in a range between about 2 g/L and about 12 g/L. The use of EDTA at the lower concentration will help to maintain a consistent deposition rate throughout a deposition process that uses a single use electroless puddle plating type process. Traditional, electroless copper electroless plating processes employ higher EDTA to copper concentrations to achieve much greater bath stability at the expense of deposition rate. These traditional electroless plating baths are harder to use since their ability to modulate fill characteristics is significantly reduced due to the adsorption of additives on the exposed surface. The high concentration of EDTA when used in a single use electroless puddle plating processes will greatly affect the deposition rates near the end of the electroless process due to the EDTA concentration increase as the water evaporates from the puddle during processing, and also due to the drop in copper concentration as it is plated out in the contact level aperture 1510 and on the field region 1505. A single use electroless puddle plating processes may be advantageous, due to ability to use solutions that have improved deposition rates without the issue of particle growth in the electroless plating solution or wafer-to-wafer electrolyte solution variation due to bath depletion.

A pH adjusting agent is added to adjust the electroless solution to a pH value in a range from about 4 to about 14. In on embodiment, the pH of the metal layer electroless deposition solution is maintained within a range of about 11 and about 14, and more preferably at a pH of about 12.5. In one embodiment, the pH of the metal layer electroless deposition solution is maintained within a range of about 11 and about 14 at the processing temperature which may be between about 60° C. and about 85° C. The pH adjusting agent may be a basic compound to increase the pH value of the electroless solution and include tetraalkylammonium hydroxides (e.g., tetramethylammonium hydroxide ($(CH_3)_4NOH$, TMAH). The pH adjusting agent may be dissolved in water prior to adjusting the pH value of the electroless solution. Other pH adjusting and buffering agents include various organic amines, particularly tertiary amines and hindred amines (e.g., triethylamines ($N(C_2H_5)_3$)).

In another embodiment, the metal layer electroless deposition solution is an aqueous solution that may contain a copper source, a reductant, a complexing agent, a pH adjusting agent, additives including levelers, and an optional surfactant as a wetting agent. The addition of the additives including levelers may be especially useful when using the metal layer electroless deposition solution to fill the contact level aperture 1510 via an electroless deposition process, such as steps 1008 and 1010, which are described above. Levelers within the metal layer electroless deposition solution are used to achieve different deposition thickness as a function of leveler concentration and feature geometry. The leveler within the metal layer electroless deposition solution may have a concentration in a range from about 20 ppb to about 600 ppm, preferably from about 100 ppb to about 100 ppm. Examples of levelers that may be employed in an electroless solution include, but are not limited to alkylpolyimines and organic sulfonates, such as 1-(2-hydroxyethyl)-2- imidazolidinethione (HIT), 4-mercaptopyridine, 2-mercaptothiazoline, ethylene thiourea, thiourea or derivatives thereof. The metal layer electroless deposition solution may also contain brighteners or accelerators and suppressors as alternative additives to provide further control of the deposition process. The role of accelerators is to achieve a smoothly deposited surface of the copper-containing layer 120. The accelerator within the metal layer electroless deposition solution has a concentration in a range from about 20 ppb to about 600 ppm, preferably from about 100 ppb to about 100 ppm. Traditional accelerators used in electrochemical plating baths may be inhibitors when used in electroless plating baths. In one aspect, traditional "accelerators" that are useful in an electroless solution for metal layer 1525 may include sulfur-based compounds such as bis(3-sulfopropyl) disulfide (SPS), 3-mercapto-1-propane sulfonic acid (MPSA), aminoethane sulfonic acids, thiourea, derivatives thereof, combinations thereof. The "accelerators" may be used in conjunction with the polymeric additives to help promote the growth in the bottom of the contact level feature 1510 (e.g., near to the silicon junction 1502) versus the field region 1505. In one aspect, quinolines may be used as an accelerator. Examples of some quinolines include that may be useful include, but are not limited to 6-Hydroxyquinoline, 8-Hydroxyquinoline, and 8-Hydroxy-7-iodo-5-quinoline-sulfonic acid.

Also, an optional surfactant may be added to the metal layer electroless deposition solution. The surfactant is a wetting agent to reduce the surface tension between the plating solution and the substrate surface. Surfactants are generally added to the electroless solution at a concentration of about 1,000 ppm or less, preferably about 800 ppm or less, such as from about 20 ppb to about 600 ppm. The surfactant may have ionic or non-ionic characteristics. A preferred surfactant includes dodecyl sulfates, such as sodium dodecyl sulfate (SDS). Other surfactants that may be used in the electroless deposition solution include glycol ether based surfactants (e.g., polyethylene glycol). For example, a glycol ether based surfactants may contain polyoxyethylene units, such as TRITON® 100, available from Dow Chemical Company. A nonylphenol ethoxylate surfactant is useful in the electroless deposition solution, such as TERGITOL®, available from Dow Chemical Company or IGEPAL-630, available from GAF Corporation. In one aspect a cationic surfactant, such as dodecyltrimethylammonium bromide $(CH_3(CH_2)_{11}N(CH_3)_3Br)$ may be used in the metal layer electroless deposition solution. Other useful surfactants may contain phosphate units, for example, sodium poly(oxyethylene)phenyl ether phosphate, such as RHODAFAC® RE-610, available from Rhodia, Inc. The surfactants may be single compounds or a mixture of compounds of molecules containing varying length of hydrocarbon chains.

The electroless deposition process to deposit metal alloy layer (e.g., 1525 or 1526) may use either a pre-mixed solution or an in-line mixing process that combines solution components to generate the metal layer electroless deposition solution. The electroless deposition process may be conducted at a temperature in a range from about 35° C. to about 85° C. A chamber useful to conduct an electroless deposition process for depositing copper-containing layers is the electroless deposition process cell, further described in the commonly assigned U.S. patent application Ser. No. 10/965,220, entitled, "Apparatus for Electroless Deposition," filed on Oct. 14, 2004, U.S. patent application Ser. No. 10/996,342, entitled, "Apparatus for Electroless Deposition of Metals on Semiconductor Wafers," filed on Nov. 22, 2004, U.S. Provisional Patent Application Ser. No. 60/575,553, entitled, "Face Up Electroless Plating Cell," filed on May 28, 2004, and U.S. Provisional Patent Application Ser. No. 60/575,558, entitled, "Face Down Electroless Plating Cell," filed on May 28, 2004, which are each incorporated by reference to the extent not inconsistent with the claimed aspects and description herein.

Novel Copper Formulation Solution—Copper Formate Solution

An example of a novel copper formulation that has been optimized for a single wafer/single use puddle plating process is described below. Notable features/differences from conventional electroless plating baths is: 1) the presence of formate ions that are may provide a secondary pathway for Cu deposition, and 2) a electroless solution that contains high reducing agent to Cu ion and EDTA ratio that is believed to permit more effective "leveling" of the deposited film due to competition between additives and reducing agent for surface sites. Use of this novel copper formulation at temperatures of about 80° C., or at higher pH values allows even faster deposition rates without noticeable loss of film quality.

In one embodiment, the novel copper formulation may include:
  0.03 M $Cu(HCO_2)_2$
  0.06 M EDTA
  0.20 M glyoxylic acid
  500 ppm PEG (4000 MW)

The plating process is performed at a plating temperature of about 70° C., and a pH at room temperature of about 12.8, and/or a pH of about 12.3 at a temperature of about 70° C. The initiation time was less than about 30 seconds using this solution.

In one example, using a barrier layer 1521 containing a metal layer stack of Ti/TiN/Ru on Silicon substrates using the novel copper formulation the following results were achieved. (i.e., 5 minute plating process)

|  | Conventional Bath | Novel Copper Formulation |
| --- | --- | --- |
| $R_s$ Resistance (Pre-anneal) | 0.8721 | 0.4575 |
| $R_s$ Resistance (Post-anneal) | 0.7745 | 0.3629 |
| pH | 12.3 at 70° C. | 12.3 at 70° C. |
| Bath Temp. (° C.) | 70 | 70 |
| Anneal (minutes/° C.) | 20/400 | 20/400 |

The conventional bath was a glyoxylic acid type electroless solution published in the literature.

While foregoing is directed to the preferred embodiment of the invention, other and further embodiments of the invention may be devised without departing from the basic scope thereof, and the scope thereof is determined by the claims that follow.

The invention claimed is:

1. A method for depositing a material on a contact level feature formed on a substrate, comprising:
    providing a substrate that has one or more contact level features comprising a doped silicon containing region;
    depositing a first metal layer on the doped silicon containing region by an electroless deposition process;
    forming an exposed silicide layer from the first metal layer;
    depositing a barrier layer over a surface of the exposed silicide layer, wherein depositing the barrier layer comprises:
        depositing a second metal layer on the exposed silicide layer; and depositing a third metal layer over the second metal layer, wherein the third metal layer contains a metal selected from a group consisting of ruthenium (Ru), cobalt (Co), nickel (Ni), rhodium (Rh), iridium (Ir), palladium (Pd) and platinum (Pt); and filling the contact level feature with a metal containing layer.

2. The method of claim 1, wherein forming the exposed silicide layer comprises heating the substrate to a temperature that causes an element in the first metal layer to form at least a portion of the exposed silicide layer.

3. The method of claim 1, further comprising depositing a cobalt containing layer on the exposed silicide layer, wherein the exposed silicide layer comprises a nickel silicide.

4. The method of claim 3, wherein the thickness of the cobalt containing layer is between about 5 angstroms and about 50 angstroms.

5. The method of claim 1, wherein the first metal layer contains an element selected from a group consisting of titanium (Ti), cobalt (Co), nickel (Ni), tungsten (W), molybdenum (Mo), and tantalum (Ta).

6. The method of claim 1, wherein the thickness of the barrier layer deposited on the exposed silicide layer is between about 10 angstroms and about 100 angstroms.

7. The method of claim 1, wherein the thickness of the first metal layer deposited on the doped silicon containing region is between about 5 angstroms and about 50 angstroms.

8. The method of claim 1, wherein the barrier layer deposited on the exposed silicide layer has a resistivity less than about $10 \times 10^{-6}$ ohm-cm.

9. The method of claim 1, wherein the metal containing layer is a copper containing layer.

10. The method of claim 9, wherein the metal containing layer further comprises copper and an element selected from a group consisting of aluminum (Al), indium (In), molybdenum (Mo), tungsten (W), manganese (Mn), cobalt (Co), palladium (Pd), nickel (Ni), tin (Sn), and ruthenium (Ru).

11. The method of claim 1, wherein the second metal layer contains an element selected from a group consisting of titanium (Ti), cobalt (Co), nickel (Ni), tungsten (W), molybdenum (Mo), nitrogen (N), and tantalum (Ta).

12. The method of claim 1, wherein the third metal layer comprises ruthenium and tantalum.

13. The method of claim 1, further comprising depositing a fourth metal layer on the second metal layer prior to depositing the third metal layer.

14. The method of claim 13, wherein the second metal layer is a titanium containing layer, the fourth metal layer is a titanium nitride containing layer and the third metal layer is a ruthenium containing layer.

15. The method of claim 1, wherein the metal containing layer is a copper containing layer that is deposited by an electrochemical deposition process.

16. A method for depositing a material on a contact level feature formed on a substrate, comprising:

providing a substrate that has one or more contact level features that have an exposed silicide layer formed on a silicon containing region;

depositing a barrier layer over a surface of the exposed silicide layer, wherein depositing the barrier layer comprises:

depositing a first metal layer on the exposed silicide layer; and depositing a second metal layer over the first metal layer, wherein the second metal layer contains a metal selected from a group consisting of ruthenium (Ru), cobalt (Co), nickel (Ni), rhodium (Rh), iridium (Ir), palladium (Pd) and platinum (Pt); and filling the contact level feature with a metal containing layer, wherein the metal containing layer comprises copper and aluminum and is deposited using an electroless solution that contains about 7 grams/liter of a copper ion source and between about 0.5 and about 6 grams/liter of an aluminum ion source.

17. A method for depositing a material on a contact level feature formed on a substrate, comprising:

providing a substrate that has one or more contact level features that have an exposed silicide layer formed on a silicon containing region;

depositing a barrier layer over a surface of the exposed silicide layer, wherein depositing the barrier layer comprises:

depositing a first metal layer on the exposed silicide layer;

depositing a second metal layer over the first metal layer, wherein the second metal layer comprises between about 70% and about 95% ruthenium and the balance tantalum; and filling the contact level feature with a metal containing layer.

18. A method for depositing a material on a contact level feature formed on a substrate, comprising:

providing a substrate that has one or more contact level features comprising a doped silicon containing region;

depositing a first metal layer on the doped silicon containing region by an electroless deposition process;

forming an exposed silicide layer from the first metal layer;

depositing a barrier layer over a surface of the exposed silicide layer, wherein depositing the barrier layer comprises:

depositing a second metal layer on the exposed silicide layer; and depositing a third metal layer over the second metal layer, wherein the third metal layer contains a metal selected from a group consisting of ruthenium (Ru), cobalt (Co), nickel (Ni), rhodium (Rh), iridium (Ir), palladium (Pd) and platinum (Pt);

electrolessly depositing a first copper containing layer on the barrier layer; and depositing a second copper containing layer on the first copper containing layer to fill the one or more contact level features.

19. The method of claim 18, wherein the second copper containing layer is pure copper layer deposited using an electrochemical deposition process.

20. The method of claim 18, wherein the first copper containing layer comprises copper and an element selected from a group consisting of aluminum (Al), indium (In), molybdenum (Mo), tungsten (W), manganese (Mn), cobalt (Co), palladium (Pd), nickel (Ni), tin (Sn), and ruthenium (Ru).

21. The method of claim 18, further comprising depositing a fourth metal layer on the second metal layer prior to depositing the third metal layer.

22. The method of claim 21, wherein the second metal layer is a titanium containing layer, the fourth metal layer is a titanium nitride containing layer and the third metal layer is a ruthenium containing layer.

23. The method of claim 18, wherein the second copper containing layer is deposited by an electrochemical deposition process.

24. A method for depositing a material on a contact level feature formed on a substrate, comprising:
- electrolessly depositing a first metal containing layer selectively on a doped silicon region on a surface of a substrate;
- forming a contact level interconnect feature, wherein the process of forming the contact level interconnect comprises:
  - depositing a dielectric layer over a surface of the substrate and the first metal containing layer; and
  - forming one or more contact level features in the dielectric layer using conventional semiconductor processing methods, wherein the first metal containing layer is exposed at the bottom of one or more of the contact level features;
- depositing a barrier layer over a surface of the first metal containing layer, wherein the depositing the barrier layer comprises:
  - depositing a second metal layer over the first metal containing layer, wherein the second metal layer contains a metal selected from a group consisting of ruthenium (Ru), cobalt (Co), nickel (Ni), rhodium (Rh), iridium (Ir), palladium (Pd) and platinum (Pt); and
- electrolessly depositing a copper containing layer on the barrier layer.

25. The method of claim 24, wherein the first metal containing layer comprises an element selected from a group consisting of cobalt (Co) and nickel (Ni).

26. The method of claim 24, further comprising depositing a cobalt containing layer on the first metal containing layer, wherein the first metal containing layer comprises a nickel containing alloy.

27. The method of claim 26, further comprising heating the substrate to a temperature that causes the nickel containing alloy to form a nickel silicide.

28. The method of claim 24, further comprising depositing a third metal layer on the first containing metal layer before depositing the second metal over the first containing metal layer.

29. The method of claim 28, wherein the third metal layer contains a metal selected from a group consisting of titanium (Ti), tantalum (Ta), tungsten (W), ruthenium (Ru), cobalt (Co), and nickel (Ni).

30. A method for depositing a material on a contact level feature formed on a substrate, comprising:
- providing a substrate that has one or more contact level features that have an exposed doped silicon containing region;
- depositing a first metal layer on the doped silicon containing region;
- depositing a barrier layer over a surface of the first metal layer, wherein the depositing the barrier layer comprises:
  - depositing a second layer over the first metal layer, wherein the second layer comprises between about 70% and about 95% ruthenium and the balance tantalum; and
- filling the contact level feature with a metal containing layer.

31. The method of claim 30, wherein depositing the barrier layer further comprises depositing a third layer on the first metal layer prior to depositing the second layer.

32. The method of claim 31, wherein the third layer contains a metal selected from a group consisting of titanium (Ti), tantalum (Ta), tungsten (W), ruthenium (Ru), cobalt (Co), nickel (Ni), rhodium (Rh), iridium (Ir), palladium (Pd) and platinum (Pt).

33. The method of claim 30, wherein the metal containing layer comprises copper.

* * * * *

UNITED STATES PATENT AND TRADEMARK OFFICE
CERTIFICATE OF CORRECTION

PATENT NO. : 7,514,353 B2
APPLICATION NO. : 11/385344
DATED : April 7, 2009
INVENTOR(S) : Weidman et al.

It is certified that error appears in the above-identified patent and that said Letters Patent is hereby corrected as shown below:

Title Page in the References Cited (56):

Please insert the following cites:

--4,366,035 A 12/1982 Wilkinson--;

--4,368,223 A 1/1983 Kobayashi et al.--;

--4,397,812 A 8/1983 Mallory, Jr.--;

--4,424,241 A 1/1984 Abys--;

--4,632,857 A 12/1986 Mallory, Jr.--;

--4,795,660 A 1/1989 Cooray et al.--;

--4,810,520 A 3/1989 Wu--;

--4,867,882 A 9/1989 O'Neill et al.--;

--5,055,199 A 10/1991 O'Neill et al.--;

--5,102,456 A 4/1992 Jagannathan et al.--;

--5,141,626 A 8/1992 Tanaka et al.--;

--5,147,692 A 9/1992 Bengston--;

--5,200,048 A 4/1993 Tanaka et al.--;

--5,203,911 A 4/1993 Sricharoenchaikit et al.--;

--5,212,138 A 5/1993 Krulik et al.--;

--5,234,628 A 8/1993 Trabitzsch et al.--;

--5,235,139 A 8/1993 Bengston et al.--;

--5,240,497 A 8/1993 Shacham et al.--;

--5,248,527 A 9/1993 Uchida et al.--;

--5,380,560 A 1/1995 Kaja et al.--;

--5,384,284 A 1/1995 Doan et al.--;

UNITED STATES PATENT AND TRADEMARK OFFICE
CERTIFICATE OF CORRECTION

PATENT NO. : 7,514,353 B2
APPLICATION NO. : 11/385344
DATED : April 7, 2009
INVENTOR(S) : Weidman et al.

It is certified that error appears in the above-identified patent and that said Letters Patent is hereby corrected as shown below:

--5,415,890 A 5/1995 Kloiber et al.--.

Signed and Sealed this

Thirtieth Day of June, 2009

JOHN DOLL
*Acting Director of the United States Patent and Trademark Office*